(12) United States Patent
Nakayama et al.

(10) Patent No.: US 6,459,630 B2
(45) Date of Patent: Oct. 1, 2002

(54) SEMICONDUCTOR MEMORY DEVICE HAVING REPLACING DEFECTIVE COLUMNS WITH REDUNDANT COLUMNS

(75) Inventors: Atsushi Nakayama; Ryo Haga, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,260

(22) Filed: Mar. 27, 2001

(30) Foreign Application Priority Data

Mar. 28, 2000 (JP) ........................................ 2000-088963

(51) Int. Cl.[7] ................................................. G11C 7/00
(52) U.S. Cl. ..................................... 365/200; 365/189.02
(58) Field of Search ............................... 365/200, 201, 365/189.07, 189.02, 230.02, 185.09

(56) References Cited

U.S. PATENT DOCUMENTS 5,025,418 A * 6/1991 Asoh ............................ 365/200
5,231,604 A * 7/1993 Watanabe .................... 365/200
6,307,794 B1 * 10/2001 Haga ............................ 365/200

FOREIGN PATENT DOCUMENTS

JP  3-176899  7/1991
JP  5-101648  4/1993

OTHER PUBLICATIONS

R. Haga, "Semiconductor Memory Device and Signal Line Shifting Method", U.S. Ser. No. 09/648,541, filed Aug. 28, 2000.

* cited by examiner

Primary Examiner—Tan T. Nguyen
(74) Attorney, Agent, or Firm—Finnegan, Henderson, Farabow, Garrett & Dunner, L.L.P.

(57) ABSTRACT

A semiconductor memory device comprises a data line shifting circuit for connecting a plurality of data lines and spare data lines to a plurality of I/O data lines, a plurality of I/O numbering circuits for assigning the I/O data lines shift indicating numbers as locational information, the shift indicating numbers incrementing by one for each start point for data line shifting executed by the data line shifting circuit, a selection circuit for storing the correlationship between defective column addresses and the shift indicating numbers and outputting a selection signal corresponding to the shift indicating numbers when a defective-column address is input, a shift control circuit for comparing the selection signal with the shift indicating numbers and outputting a shift control signal to the data line shifting circuit based on a result of the comparison, and a number setting selecting circuit for selectively using a plurality of I/O numbering circuits.

21 Claims, 22 Drawing Sheets

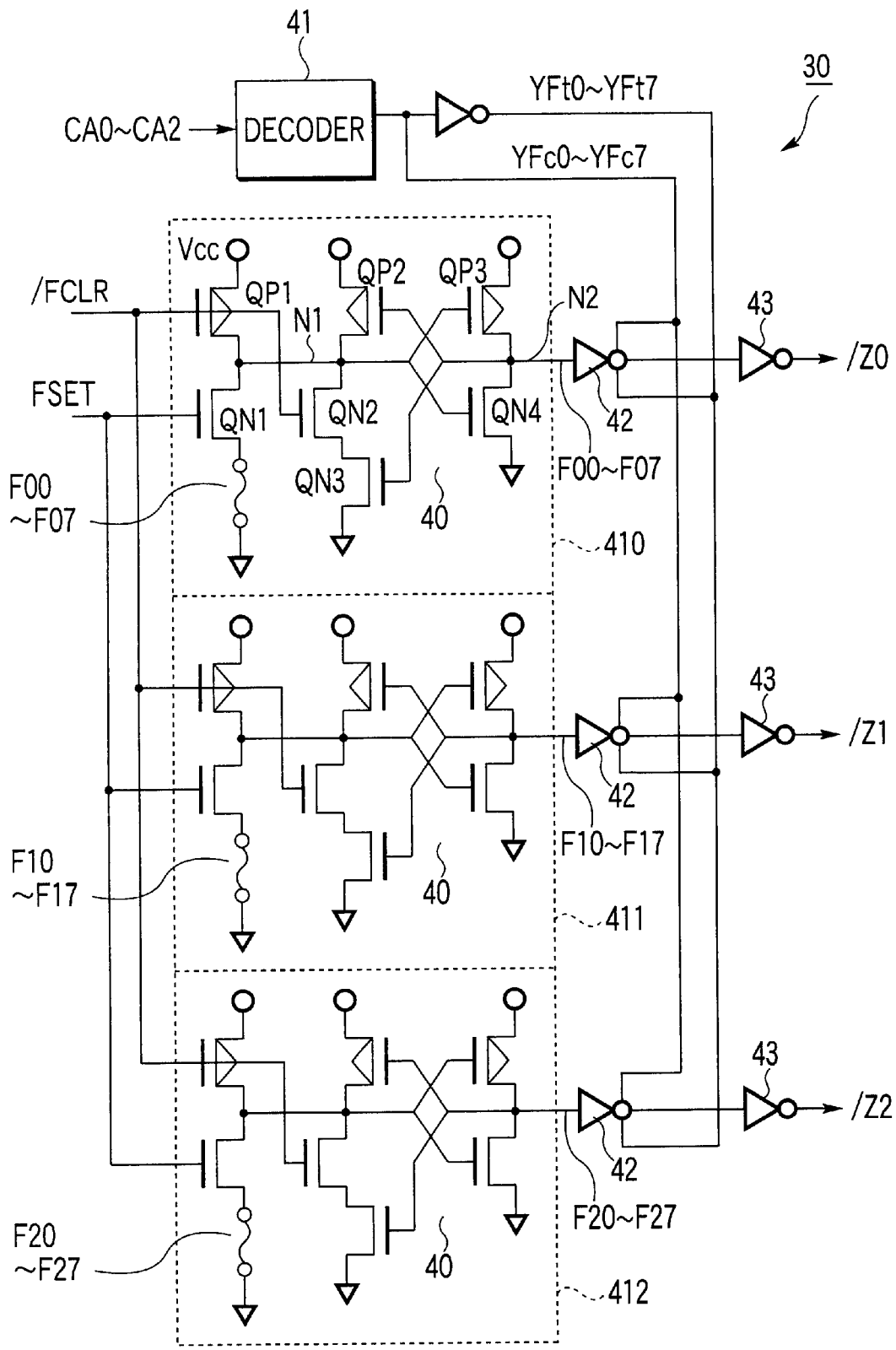
F I G. 9

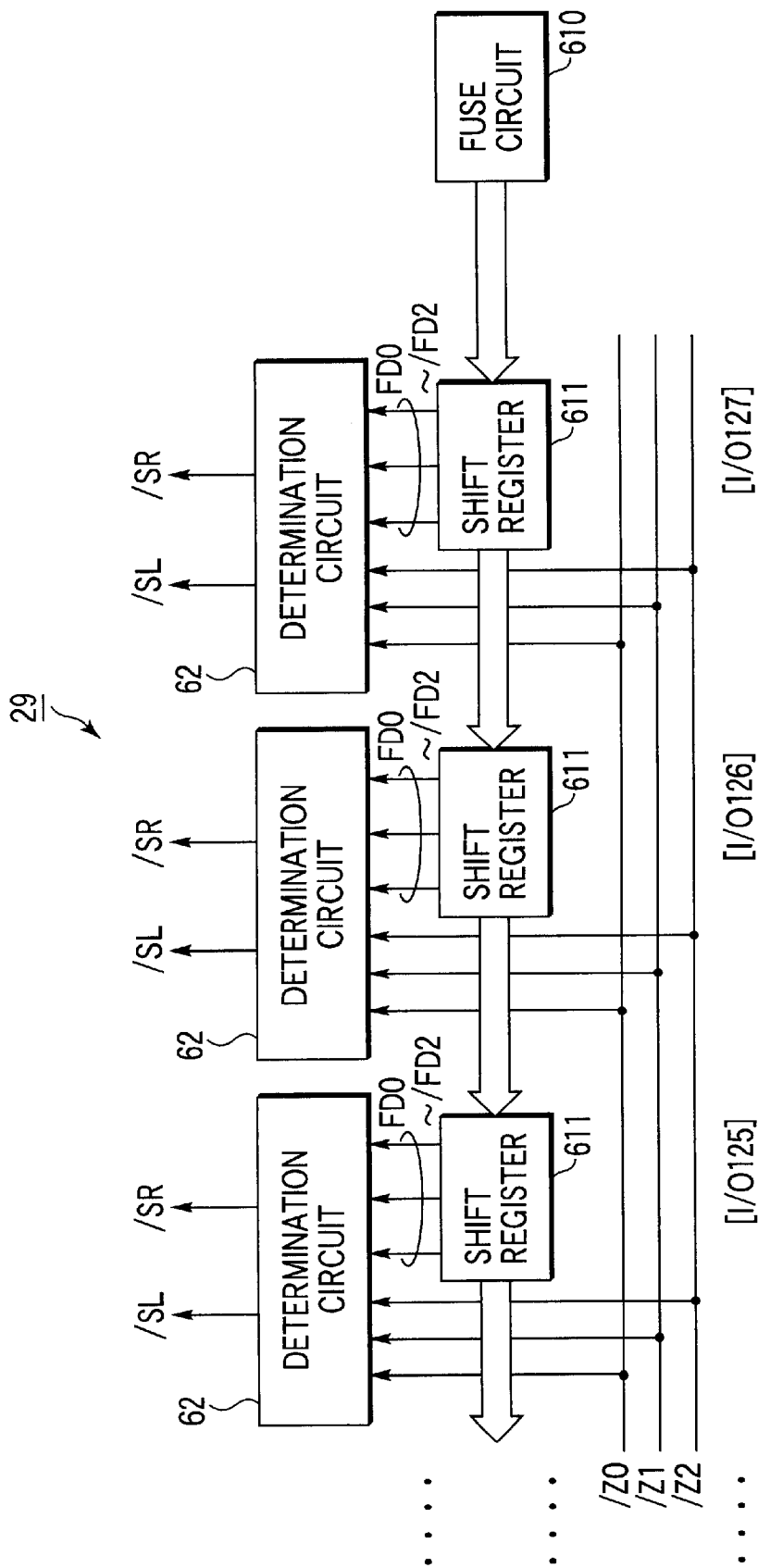
F I G. 16

| | I/00 | I/01 | I/02 | I/03 | I/04 | I/05 | I/06 | I/07 | I/08 | |
|---|---|---|---|---|---|---|---|---|---|---|
| SHIFT INDICATING NUMBER | 0 | 1 | 2 | 2 | 2 | 3 | 3 | 4 | 4 | ...... |
| SHIFT REGISTER (Fp) | 0 | 1 | 1 | 0 | 0 | 1 | 0 | 1 | 0 | |

SEMICONDUCTOR MEMORY DEVICE HAVING REPLACING DEFECTIVE COLUMNS WITH REDUNDANT COLUMNS

CROSS-REFERENCE TO RELATED APPLICATIONS

This application is based upon and claims the benefit of priority from the prior Japanese Patent Application No. 2000-088963, filed Mar. 28, 2000, the entire contents of which are incorporated herein by reference.

BACKGROUND OF THE INVENTION

The present invention relates to a semiconductor memory device, for example, a dynamic random access memory (DRAM), and in particular, to a semiconductor memory device having a function of switching data lines based on a data line-shifting redundancy method to relieve defective columns and testing redundancy cells.

A semiconductor memory device such as a DRAM is provided with redundancy memory cells in addition to normal memory cells and comprises a redundant circuit to relieve some defective cells randomly present in the normal memory cells. The defective cells are replaced with redundant rows or columns using as relieved units defective rows or columns in which the defective cells are present.

In a normal redundant circuit, a fuse circuit storing defective address data is mounted on a memory chip. Address data input to the memory are compared with data stored in the fuse circuit, and when the data are equal, a replacement signal is generated to select redundant rows or columns for defective rows or columns.

Then, the defective column relieve method is focused on. When the defective columns are correlated with the redundant columns on a one-to-one correspondence, the scale of the column redundant circuit must be increased if an attempt is made to increase defective column relieve efficiency.

Thus, as a method for making it possible to efficiently relieve defective columns with a smaller-scale circuit, a data line-shifting redundant circuit based on shifting of data lines is disclosed, for example, in Jpn. Pat. Appln. KOKAI Publication No. 3-176899 and No. 5-101648.

In the data line-shifting redundant circuit disclosed in these publications, when a defective address corresponding to a defective column is input, a data line that outputs readout data corresponding to this defective column is replaced with an adjacent normal data line for use. For the addresses following this defective address, data lines are subjected to shift control so as to be sequentially shifted in such a manner that only normal data lines including a spare data line arranged at an end of the array of the data lines are connected to a data I/O line.

A conventional column redundant circuit provided in a DRAM will be described below.

FIG. 1 is a block diagram showing an example of the configuration of a conventional column redundant circuit.

A switching circuit 11 switches a connection to a memory cell array 12 between a first group of data lines I/O LINES #1 and a second group of data lines I/O LINES #2 in order to transfer readout/write data to and from the memory cell array 12. The switching circuit 11 has its operation controlled by means of a switch status signal issued by an analyzer 13 according to a column address signal CA.

FIG. 2 is a block diagram showing an example of a configuration where a data line-shifting redundant circuit is provided as the column redundant circuit in FIG. 1.

The switching circuit 11 is controlled by means of the switch status signal so as to switch a connection path between the first group of data lines I/O LINES #1 and the second group of data lines I/O LINES #2 based on the data line shifting method.

Repeated structures (the portions enclosed by dot lines) in the switching circuit 11 are each called an I/O unit 11A.

Each I/O unit 11A has an I/O number that is information on itself. The I/O number is often an address.

The switch status signal output from the analyzer 13 according to each column address signal CA is represented by a shift number corresponding to the I/O number. Thus, a fuse circuit is provided which is composed of a plurality of fuse elements storing information (reconnection information) on the correlationship between the column address signals CA and the switch status signals. FIG. 2 shows an operational state in which a shift number 4 is issued as the switch status signal.

The I/O units 11A having an I/O number equal to or larger than the shift number issued by the analyzer 13 performs a shift operation such that each relevant data line of the group of data lines I/O LINES #2 is connected to one of the group of data lines I/O LINES #1 which is adjacent to another of the data lines I/O LINES 1 which corresponds to the first data line. In FIG. 2, all the I/O units 11A having an I/O number of 4 or more execute reconnections.

In the data line-shifting redundant circuit in FIG. 2, a start point for data line shifting which corresponds to a defective column address is stored in a fuse element in the fuse circuit 14. In this configuration, however, with a large number of data lines of the first and second groups, a large number of selection signal lines (shift number transfer lines) for shift-controlling the data lines are required, thus complicating the configuration of the switching circuit 11 for shifting the data lines.

Thus, an improved data line-shifting redundant circuit that requires a reduced number of selection signal lines for shift-controlling the data lines has been proposed. This data line-shifting redundant circuit has a configuration such as that shown in FIG. 3.

This circuit differs from the data line-shifting redundant circuit shown in FIG. 2 in that the I/O numbers provided for the I/O units 11A are not the addresses but numbers varying with groups.

In this case, the plurality of I/O units 11A can be classified into groups each of which has the same redundancy status despite the variation of the column address CA.

The circuit additionally has an I/O numbering circuit 15 for providing numbers varying with the group, as the I/O numbers provided to the I/O units 11A. For example, the plurality of I/O units 11A are represented as lower units having lower I/O numbers (in the left of the figure) and higher units on the opposite side (in the right of the figure).

In addition to the fuse circuit 14 having the information (reconnection information) on the correlationship between the column address signals CA and the switch status signals, a fuse circuit 16 is provided which has a plurality of fuse elements storing information (reconnection information) on the correlationship between the I/O units 11A and the I/O numbers.

FIG. 3 shows an operational state in which a shift number 1 is issued as the shift status signal. This configuration makes it possible to reduce the varying range of the value of the shift number, thus reducing the number of wires for transmitting the shift status to the I/O units 11A.

In a DRAM having the data line-shifting redundant circuit, it is assumed that the circuit is provided with a forced access mode for forcibly accessing memory cells regardless of the storage statuses of the fuse circuits storing the reconnection information. A mode in which memory cells are accessed while reconnections are being carried out in order to relieve defective memory cells is called an "normal access mode".

If the forced access mode is added to the circuit, it can be implemented using a certain method. A specific example of a circuit with the forced access mode added thereto is the configuration shown in FIGS. 4 and 5.

The circuit in FIG. 4 is a DRAM having the data line-shifting redundant circuit in FIG. 3, the DRAM being configured so that in a test mode, the switch status signal determined by the column address CA is neglected, while the switch status signal with the shift number 4 is output to the I/O units 11A. In this case, no I/O unit 11A has a shift number equal to or larger than 4, reconnections are not carried out, that is, reconnections are forcibly disabled (forcibly disabling status), thus making irrelevant the storage statuses of the fuse circuits having the reconnection information.

On the other hand, the circuit in FIG. 5 is a DRAM having the data line-shifting redundant circuit, the DRAM being configured so that in the test mode, the switch status signal determined by the column address CA is neglected, while the shift status signal having a shift number −1 is output to the I/O units 11A. In this case, for all the switch status signals and all the I/O numbers, "I/O number"≧"switch number" is established, that is, reconnections are forcibly executed (forcibly enabling status), thus making irrelevant the storage statuses of the fuse circuits having the reconnection information.

Next, considerations required to implement the forced access mode using the method for changing the switch status signal as described above will be described.

In the test mode, if the shift status signal with the shift number 4 or −1 is output to the I/O units 11A, a logic circuit for determining whether the circuit is in the normal or forced access mode must be incorporated in the circuit for generating the switch status signal.

The switch status signal, however, is determined by the column address CA, which varies at a very high speed, so that the logic circuit incorporated in the circuit for generating the switch status signal as described above may reduce the speed at which memory cells are accessed in the normal access mode. Further, it is undesirable in terms of the characteristics of the test mode that the switch status signal, varying at a very high speed, passes along different signal paths in the normal access mode and in the forced access mode.

BRIEF SUMMARY OF THE INVENTION

The present invention is adapted to solve the above problems, and it is an object thereof to provide a semiconductor memory device which can reduce the varying range of the value of a shift number to thereby reduce the number of wires for transmitting a switch status signal to I/O units and which can restrain a decrease in a memory access speed in the normal access mode even if memory cells are forcibly accessed irrespective of the contents of a memory circuit having reconnection information.

According to a first aspect of the present invention, there is provided a semiconductor memory device comprising a memory cell array including memory cells arranged in a matrix and having a plurality of columns, at least one redundant column cell array provided adjacent to the memory cell array, for relieving defective columns in the memory cell array, a plurality of data lines for transferring readout data read out from the memory cell array or write data to be written to the memory cell array, at least one spare data line provided adjacent to the plurality of data lines, for transferring readout data read out from the redundant column cell array or write data to be written to the redundant column cell array, a plurality of I/O lines provided correspondingly to the plurality of data lines, for transmitting and receiving readout/write data to and from the plurality of data lines, a data line-shifting circuit for receiving a shift control signal and controlling connections between the plurality of I/O lines and both the plurality of data lines and the at least one spare data line based on the shift control signal, a first I/O number generating circuit for generating, as locational information assigned to each of the plurality of I/O lines, shift indicating numbers that increment by one for each of a plurality of I/O lines starting with the I/O line corresponding to the data line to transfer data on a defective one of the plurality of columns, the plurality of I/O lines including the above-mentioned I/O line and arranged on one side relative to the above-mentioned I/O line, a second I/O number generating circuit for generating shift indicating numbers all having the same value, as locational information assigned to each of the plurality of I/O lines, a shift indicating number selecting circuit for selecting shift indicating numbers generated by the first and second I/O number generating circuits, a shift indicating number memory circuit for storing the shift indicating numbers selected by the shift indicating number selecting circuit, a selection circuit for storing the correlationship between the addresses of the defective columns and the shift indicating numbers and outputting a selection signal corresponding to the shift indicating numbers when the address of the defective column is input, and a shift control circuit to which the selection signal output from the selection circuit and the shift indicating signal stored in the shift indicating number memory circuit are input and which compares the selection signal and the shift indicating number together to output the shift control signal to the data line-shifting circuit based on a result of the comparison, wherein if the shift indicating number selecting circuit selects the shift indicating number generated by the first I/O number generating circuit, the data line shifting circuit receives the shift control signal output from the shift control circuit and performs a first connection control operation of excluding the data line to transfer data on the defective column to sequentially shift a plurality of data lines adjacent to the excluded data line on one side thereof before correspondingly connecting the shifted data lines and the at least one spare data line to the plurality of I/O lines.

According to a second aspect of the present invention, there is provided a semiconductor memory device comprising a memory cell array including memory cells arranged in a matrix and having a plurality of columns, at least one redundant column cell array provided adjacent to the memory cell array, for relieving defective columns in the memory cell array, a plurality of data lines for transferring readout data read out from the memory cell array or write data to be written to the memory cell array, at least one spare data line provided adjacent to the plurality of data lines for transferring readout data read out from the redundant column cell array or write data to be written to the redundant column cell array, a plurality of I/O lines provided correspondingly to the plurality of data lines so as to transmit and receive readout/write data to and from the plurality of data lines, a data line shifting circuit for receiving a shift control signal and controlling connections between the plurality of I/O lines and both the plurality of data lines and the at least one spare data line based on the shift control signal, a I/O number generating circuit for generating, as locational information assigned to each of the plurality of I/O lines, shift indicating numbers that increment by one for each of a plurality of I/O lines starting with the I/O line corresponding to the data line to transfer data on a defective one of the plurality of columns, the plurality of I/O lines including the above-mentioned I/O line and arranged on one side relative to the above-mentioned I/O line, a shift indicating number modifying circuit for modifying all the shift indicating numbers generated by the I/O number generating circuit so as to have the same value, a selection circuit for storing the correlationship between the addresses of the defective columns and the shift indicating numbers and outputting a selection signal corresponding to the shift indicating number when the address of the defective column is input, and a shift control circuit to which the selection signal output from the selection circuit and the shift indicating signal stored in the shift indicating number memory circuit are input and which compares the selection signal and the shift indicating number together to output the shift control signal to the data line shifting circuit based on a result of the comparison, wherein if the shift indicating number modifying circuit does not modify the shift indicating number, the data line shifting circuit receives the shift control signal output from the shift control circuit and performs a first connection control operation of excluding the data line to transfer data on the defective column to sequentially shift a plurality of data lines adjacent to the excluded data line on one side thereof before correspondingly connecting the shifted data lines and the at least one spare data line to the plurality of I/O lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a circuit diagram showing an example of a selection circuit in FIG. 6;

FIG. 16 is a block diagram showing an example of another configuration of the shift control circuit in FIG. 11;

DETAILED DESCRIPTION OF THE INVENTION

Figure 1:
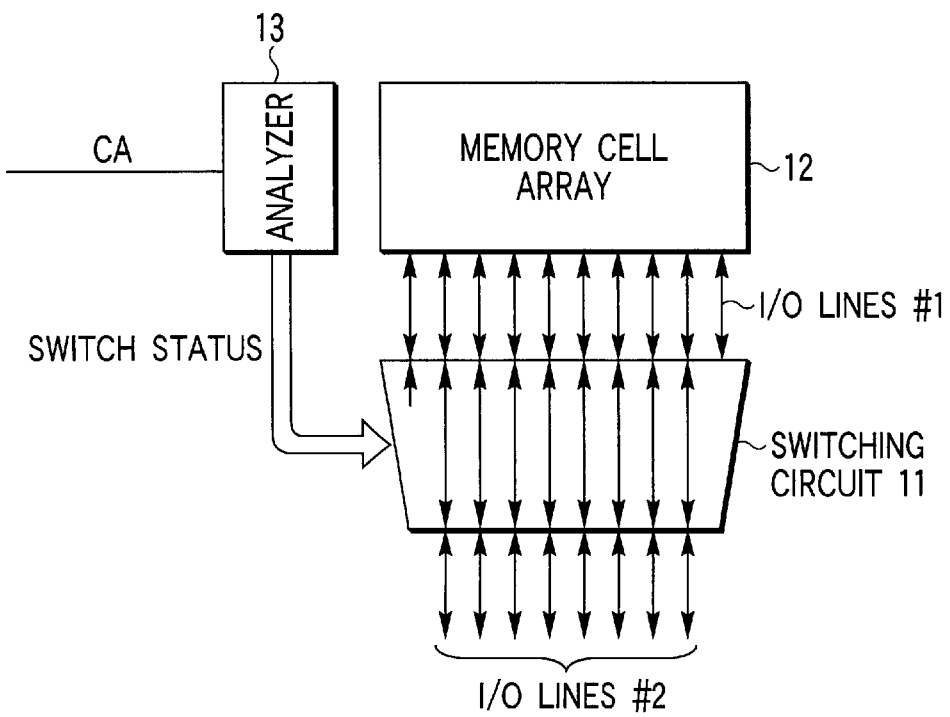
FIG. 1 is a block diagram showing an example of a column redundant circuit provided in a conventional DRAM.
Figure 2:
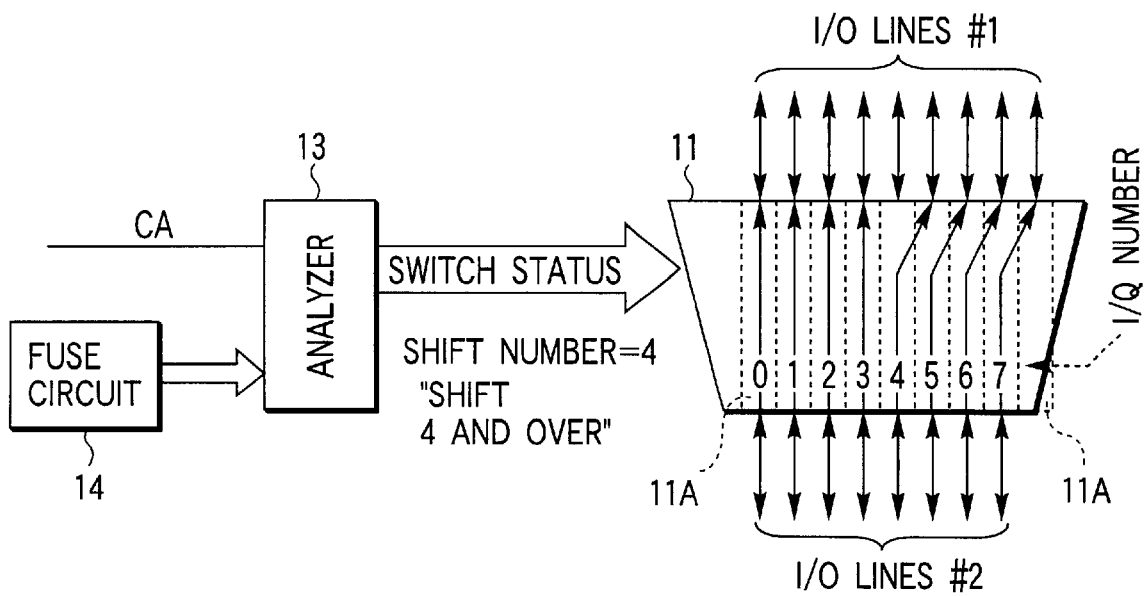
FIG. 2 is a block diagram showing an example of a configuration having a data line-shifting redundant circuit as the column redundant circuit in FIG. 1.
Figure 3:
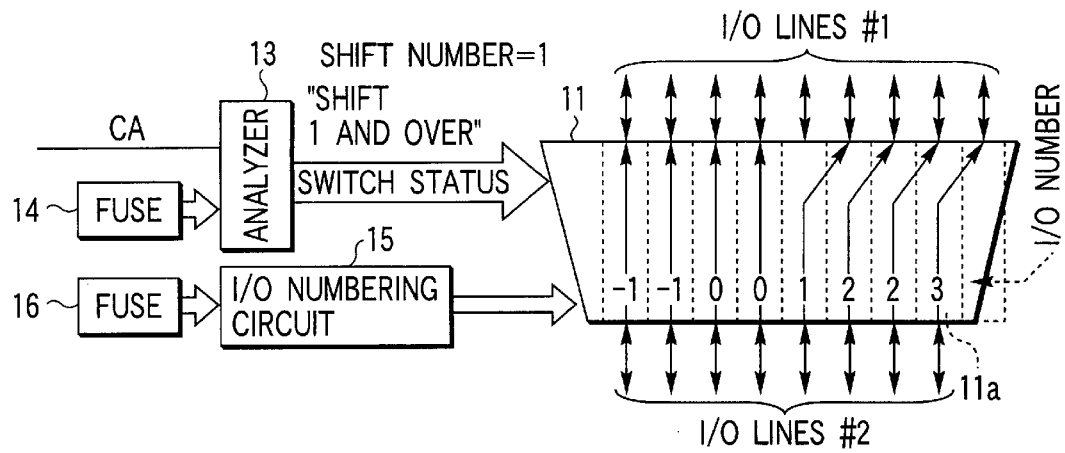
FIG. 3 is a block diagram showing another example of the data line-shifting redundant circuit.
Figure 4:
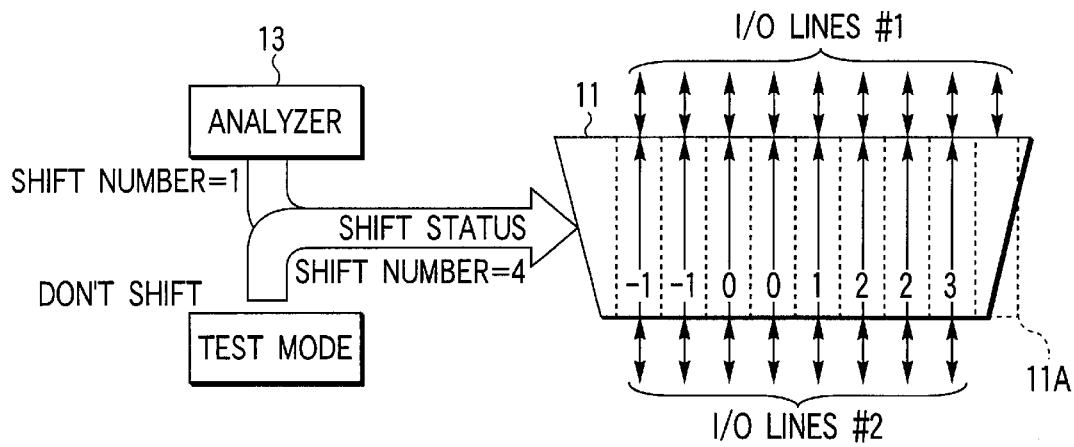
FIG. 4 is a block diagram showing an example of a possible configuration wherein a forced access mode (forced redundancy mode) is added to the data line-shifting redundant circuit in FIG. 3.
Figure 5:
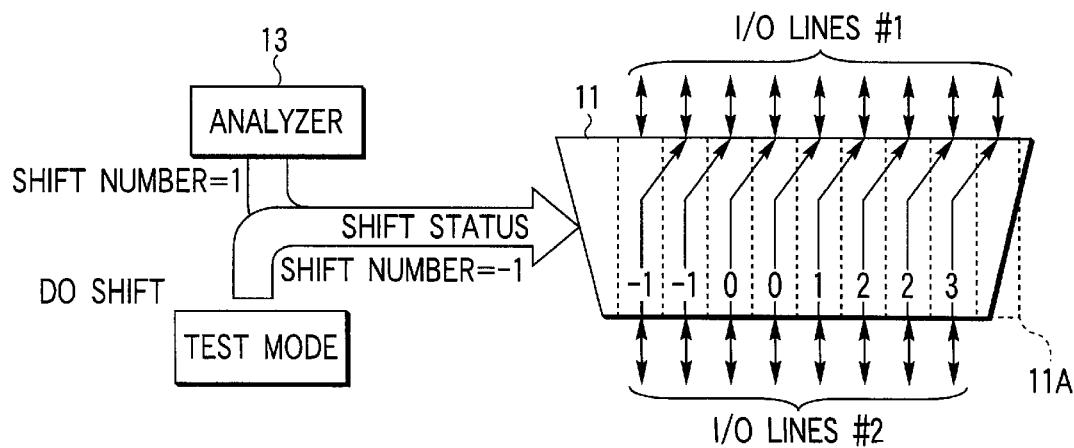
FIG. 5 is a block diagram showing another example of a possible configuration wherein the forced access mode (forced redundancy mode) is added to the data line-shifting redundant circuit in FIG. 3.
Figure 6:
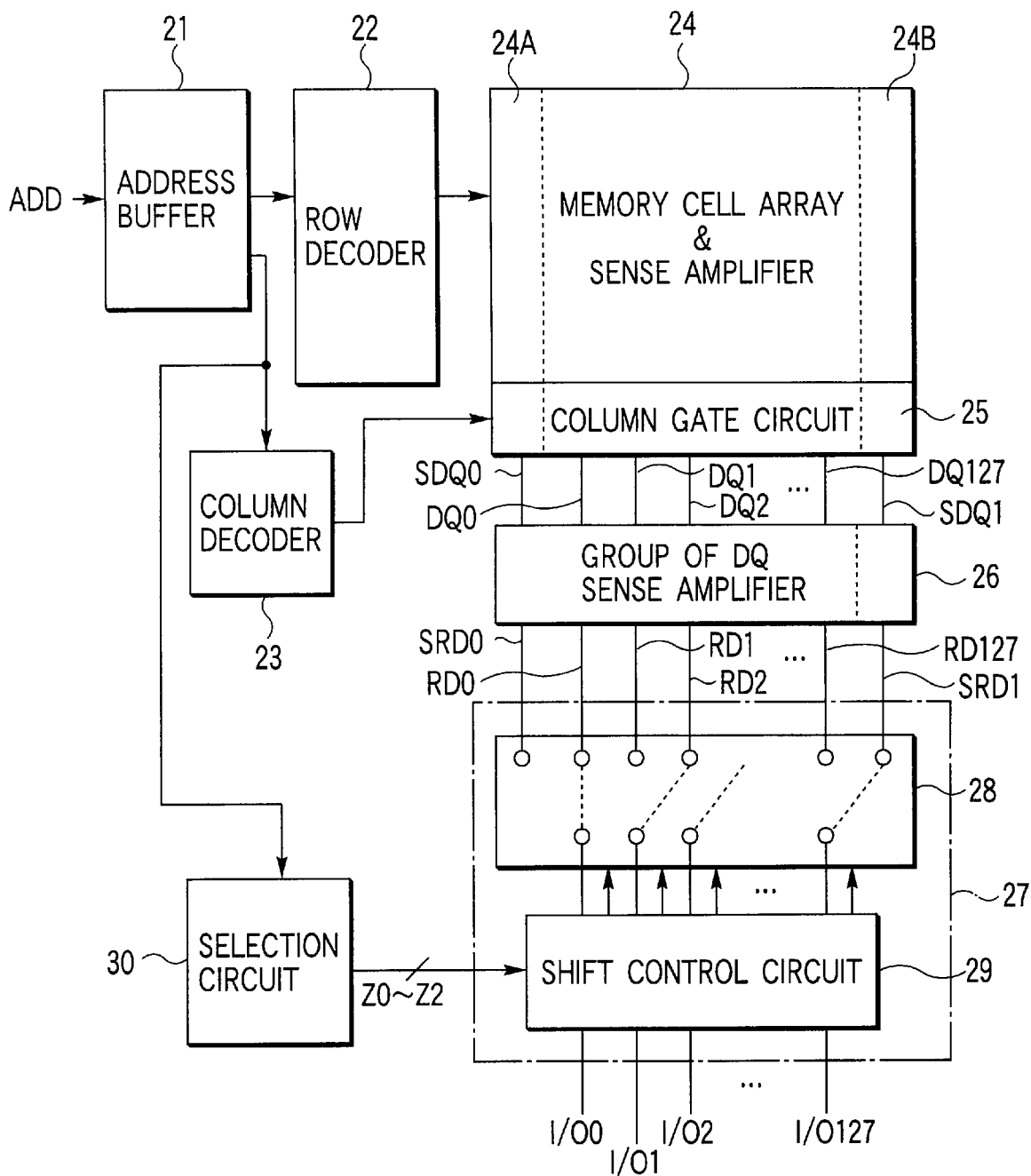
FIG. 6 is a block diagram schematically showing the configuration of a DRAM according to a first embodiment of the present invention.

FIG. 6 is a block diagram of a DRAM of the present invention having a data line-shifting redundant circuit as a column redundant circuit. This DRAM may be mounted on the same chip as a logic circuit configured using gate arrays or standard cells.

An address ADD is loaded in an address buffer 21, so that a row address and a column address are decoded by a row decoder 22 and a column decoder 23, respectively. The row decoder 22 selects a word line WL, described later, in a memory cell array 24 including a sense amplifier, while the column decoder 23 selects and drives a column gate circuit 25. The column gate 25 selects a bit line BL, described later, in the memory array cell 24 and connects it to a corresponding data line DQ (this example includes data lines DQ0 to DQ127).

Figure 7:
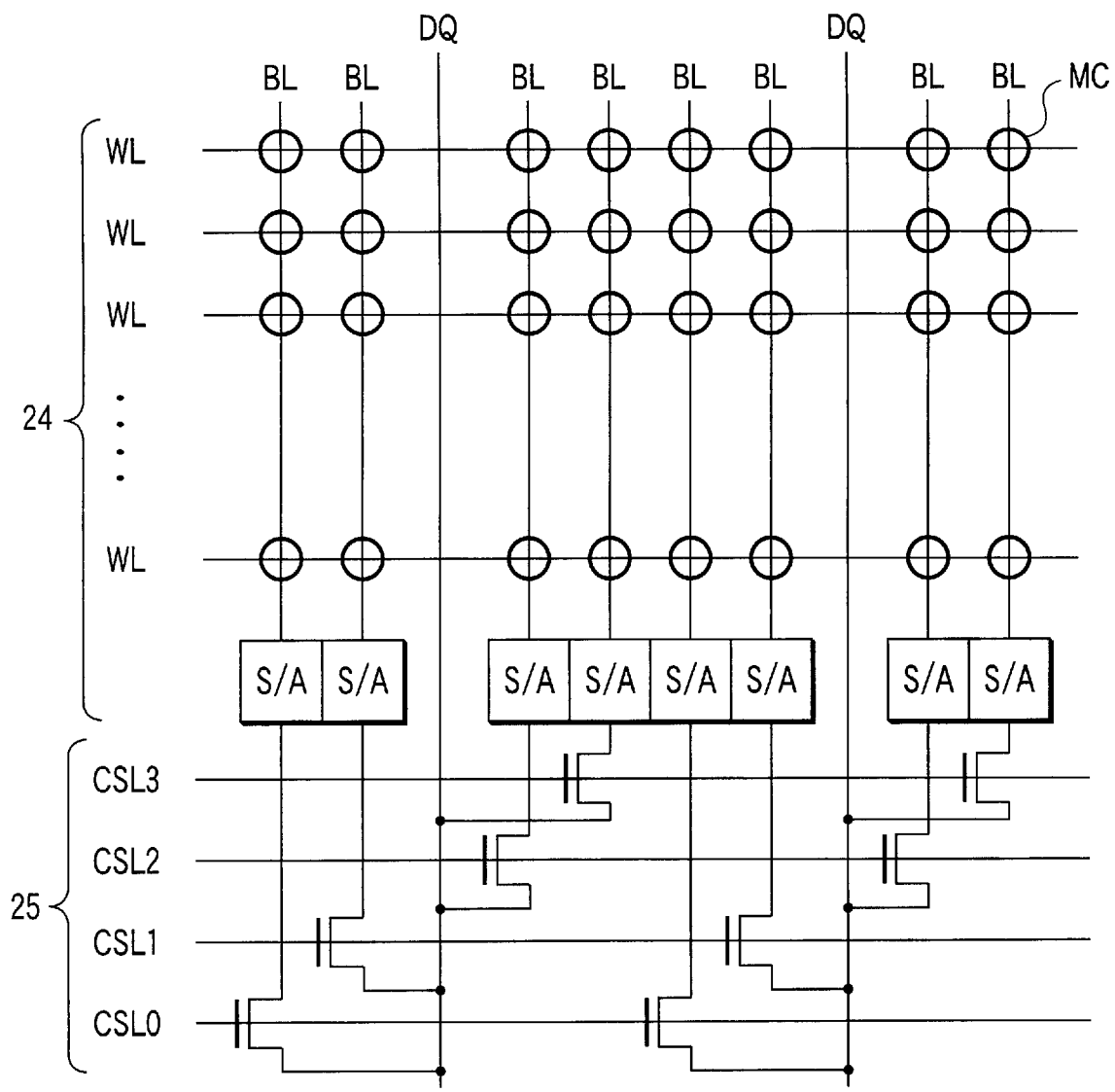
FIG. 7 is a schematic view showing the configuration of a memory cell array in FIG. 6.

FIG. 7 schematically shows the configuration of the memory cell array 24. The memory cell array 24 has a dynamic memory cell MC arranged at each of the intersections between a plurality of word lines WL and a plurality of bit lines BL (the word lines and bit lines are actually paired), with a bit line sense amplifier S/A connected to each of the bit lines BL.

A plurality of data lines DQ are arranged on the memory cell array 24 in such a manner as to cross it as shown in FIG. 7. The data lines DQ are connected to data lines RD0 to RD127 via a group of sense amplifiers 26. Although FIG. 6 shows only the data lines RD for data reads, write data lines are actually arranged in parallel with the data lines RD but are omitted.

In this example, redundant column cell arrays 24A and 24B are provided adjacent to the memory cell array 24 at opposite ends thereof in the direction of the word lines as redundant circuits for relieving defective columns. Bit lines in the redundant column cell arrays 24A and 24B are connected to a multiplexor circuit 27 via a column gate circuit 25 and spare data lines SDQ0 and SDQ1 in this order. The group of sense amplifiers 26 are inserted in the middle of the space data lines SDQ0 and SDQ1.

In this example, when data are read out from the memory cell array 24, 128 bit line data are simultaneously transferred to the 128 data lines DQ0 to DQ127 selected by the column gate circuit 25. When data are written to the memory cell array 24, data from the 128 data lines DQ0 to DQ127 are simultaneously transferred to the 128 bit lines selected by the column gate circuit 25.

To relieve a defective column, the multiplexor circuit 27 switches connections between the data lines DQ0 to DQ127 and I/O lines I/O0 to I/O127. That is, when a defective-column address is input, the multiplexor circuit 27 performs a shift operation of connecting a group of normal data lines including the space data lines SDQ0 or SDQ1 to the group of I/O lines in such a manner that the data lines are sequentially shifted while a data line DQi (i=0 to 127) to which bit line data for the defective column are to be output is excluded from the connection.

The multiplexor circuit 27 comprises a data line shifting circuit 28 and a shift control circuit 29 for controlling the shift operation of the data line shifting circuit 28. The shift operation in the multiplexor circuit 27 is controlled by a selection circuit 30.

The selection circuit 30 has a fuse circuit for storing the correlationship between the addresses of defective columns and shift indicating numbers assigned to the I/O lines so as to increment by one for each I/O line starting with a start point for data line shifting by the data line shifting circuit 28; when the address of a defective column is input, selection signals Z0 to Z2 corresponding to the shift indicating numbers are output.

The shift control circuit 29 has a fuse circuit for holding the above shift indicating number for each I/O line, to compare the selection signal output from the selection circuit 30 with the held shift indicating numbers to thereby output a shift control signal to the data line shifting circuit 28 based on a result of the comparison, the signal causing the data line shifting circuit 28 to shift data lines having the selected number or larger (or smaller).

When a defective column in the memory cell array 24 is accessed, the data line shifting circuit 28 sequentially shifts data lines starting with the one to transfer data on the defective column and arranged on one side thereof, and then connects the shifted data lines to the I/O lines together with the spare data lines.

Next, the basic concept of the data line shifting operation in the multiplexor circuit 27 will be explained with reference to FIG. 8.

The memory cell array 24 is divided into a plurality of subarrays, across which the plurality of data lines DQ0 to DQ127 are disposed. In each subarray, one data line has, for example, four bit lines (actually four pairs) of four columns Co10 to Co13 connected thereto. The example of four columns per data line is shown for simplified explanation, but in fact, the circuit often has 8 or 16 columns per data line. The positions of defective columns are shown by crosses. That is, the column Co11 is defective in the data line DQ1, the columns Co12 and Co13 are defective in the data line DQ2, and the column Co10 is defective in the data line DQ5.

In this example, data line shift indicating numbers each assigned to a corresponding one of the data lines are used to shift the data lines when any of these defective columns is accessed. As shown in FIG. 8, the data line shift indicating numbers increment by one for each defective column in the order of the data line arrangement (in this example, from left to right) regardless of the column address of the defective.

Figure 8:
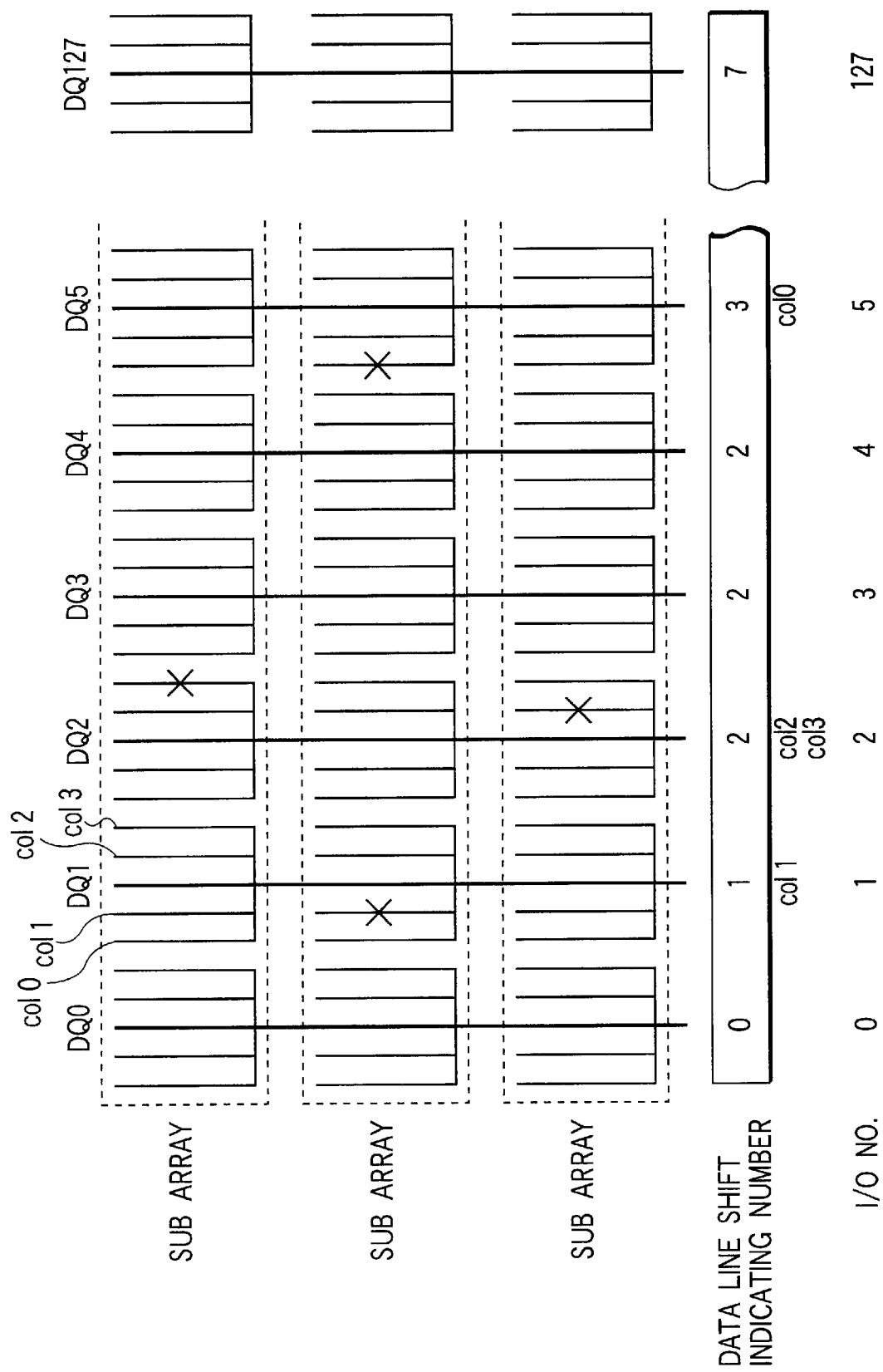
FIG. 8 is a view useful in explaining the principle concept of a data line shifting operation in a multiplexor circuit in FIG. 6.

That is, in the example shown in FIG. 8, the data line DQ0 has no defective and is thus assigned with a data line shift indicating number "0", and the next data line DQ1 has a defect in the column Co11 and the data line shift indicating number is incremented by one so that "1" w is assigned to the data line DQ1. The next data line DQ2 has defects in the columns Co12 and Co13 and the data line shift indicating number is incremented by one so that "2" is assigned to the data line DQ2. The next data lines DQ3 and DQ4 have no defect and are thus assigned with the same data line shift indicating number "2", as that for the data line DQ2. For the following data lines, the data line shift indicating numbers, incrementing by one for each defective column, are similarly set.

In this example, the data line shift indicating number is expressed by one of eight numbers ranging from 0 to 7, using a 3-bit signal. The data line shift indicating number corresponds to the number of defective columns, and the number 7 is used for eight defective columns. A data line shift indicating number of "1" or more means the necessity of shifting.

If, for example, the column address Col1 is input, the data line shift indicating number "1" corresponds to this column address and data lines having a data line shift indicating number of "1" or more are to be shifted. That is, the I/O line I/O1, which has been to be connected to the data line DQ1, is instead connected to the adjacent data line DQ2, and the following connections between the I/O lines and the data lines are sequentially shifted, with the last I/O line I/O127 connected to the spare data line SDQ1.

When the column address Co12 or Co13 is input, the data line DQ2 and the following data lines are to be shifted as described above; when the column address Col10 is input, the data line DQ5 and the following data lines are to be shifted.

Only the unidirectional data line shifting has been described, but if the redundant column cell arrays 24A and 24B are arranged at opposite ends of the memory cell array 24 and the spare data lines SDQ0, SRD0, SDQ1, and SRD1 are correspondingly arranged, then the data lines are shifted in both directions. For example, defects on the right side of the data line arrangement relative to its central portion are processed by shifting the data lines rightward using the spare data lines SDQ1 and SRD1, whereas defects on the left side of the data line arrangement relative to its central portion are processed by shifting the data lines leftward using the spare data lines SDQ0 and SRD0.

If the data line shift indicating numbers are set for the data lines as described above, first information for determining the shift indicating numbers of the I/O data line numbers I/O No. 0 to 127 shown in FIG. 8 and second information for determining the shift indicating numbers of the columns is required in order to determine a start point for data line shifting when an address is actually input.

In this example, the first information is held in the shift control circuit 29 in the multiplexor circuit 27 in FIG. 6 as fuse information, whereas the second information is held in the selection circuit 30 in FIG. 6 as fuse information.

Figures 10, 11:
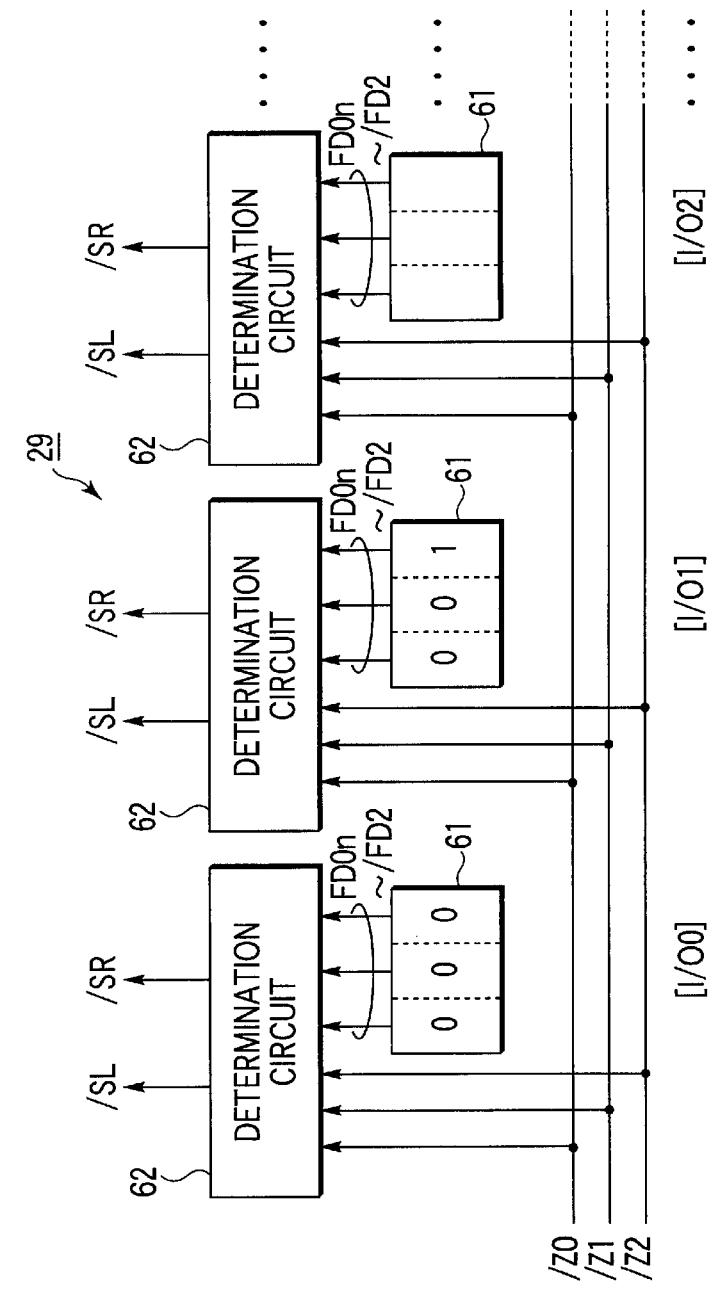
FIG. 10 is a view useful in explaining a function of assigning fuse elements provided in the selection circuit in FIG. 9.
FIG. 11 is a block diagram showing an example of a shift control circuit in FIG. 11.

FIG. 9 shows the specific circuit configuration of the selection circuit 30 in FIG. 6. In this example, the eight shift indicating numbers are allotted to the 3-bit column address CA0 to CA2. Thus, as shown in FIG. 10, (the number of columns×3) fuse elements F00 to F07, F10 to F17, and F20 to F27 are used. These fuse elements may be of a laser program type that is programmed using laser-based fusion or an electric program type for which programming is executed by cutting terminals or making them electrically conductive by applying a voltage or a current. The fuse elements are preferably of the electric program type.

The fuse circuits 410, 411, and 412, each comprising eight fuse elements, have the same circuit configuration so as to correspond to the 3 bits of the data shift indicating number. The fuse circuits each have a latch circuit 40 comprising NMOS transistors QN3 and QN4 and PMOS transistors QP2 and QP3. The latch circuits 40 each latch fuse data.

The bit data in the data shift indicating number set depending on the defective-column address are programmed in the fuse elements F00 to F07, F10 to F17, and F20 to F27 as described with reference to FIG. 8. A node N1 of each latch circuit 40 is connected to one end of each fuse element via the NMOS transistor QN1 and is connected to the node of a power source Vcc via the PMOS transistor QP1. The NMOS transistor QN2, which temporarily stops the operation of the latch circuit 40, is inserted between the node N1 and the NMOS transistor QN3.

An operation of transferring programmed fuse data to the latch circuit 40 is controlled by means of a clear signal /FCLR and a set signal FSET. That is, after power-on, the signal /FCLR first becomes "L" to turn the NMOS transistor QN2 on to cause the latch circuit 40 to temporarily stop the latch operation. Further, the PMOS transistor QP1 is turned on to preset the node N1 to "H" via the PMOS transistor QP1. Then, the signal /FCLR becomes "H" and the signal FSET becomes "H", so that the node N1 maintains the "H" level or becomes "L" depending on a cut/non-cut status of the fuse element, thereby causing the fuse data to be set in the latch circuit 40.

Moreover, the column addresses CA0 to CA2 are input to the selection circuit 30. The input column addresses are decoded by a decoder 41 to obtain complementary signals Yft0 to YFt7 and Yfc0 to YFc7. The eight nodes N2 of the latch circuit 40 in each of the fuse circuits 410, 411, and 412 have clocked inverters 42 controlled by means of the decoded complementary signals /Yft0 to /YFt7 and Tfe0 to YFe7. This causes 3 bits to be obtained from the fuse data F00 to F07, F10 to F17, and F20 to F27 held by the fuse circuits, 410, 411, and 412 so that each of the 3 bits is obtained from the eight fuse bits held by the corresponding fuse circuit. Accordingly, 3-bit fuse data, that is, selection signals /Z0, /Z1, and Z2 are output via inverters 43. The selection signals /Z0, /Z1, and Z2 contain data which are all "1" (="H") for a normal column and which mean, when a defective-column address is input, a data shift indicating number set correspondingly to the defective-column address as described in FIG. 8.

FIG. 11 shows the specific circuit configuration of the shift control circuit 29 in FIG. 6, to which the 3-bit selection signals output from the selection circuit 30 in FIG. 9 depending on the column address are supplied. The shift control circuit 29 has shift-indicating-number holding circuits 61 provided for the corresponding I/O lines for holding the data shift indicating numbers set for the corresponding I/O lines and determination circuits 62 provided for the corresponding I/O lines, for comparing the fuse data in the holding circuits 61 with the selection signals /Z0 to /Z2 transmitted from the selection circuit 30 to output shift a control signal /SL or /SR. The shift control signals /SL and /SR indicate a left and a right shifts, respectively.

Figure 12:
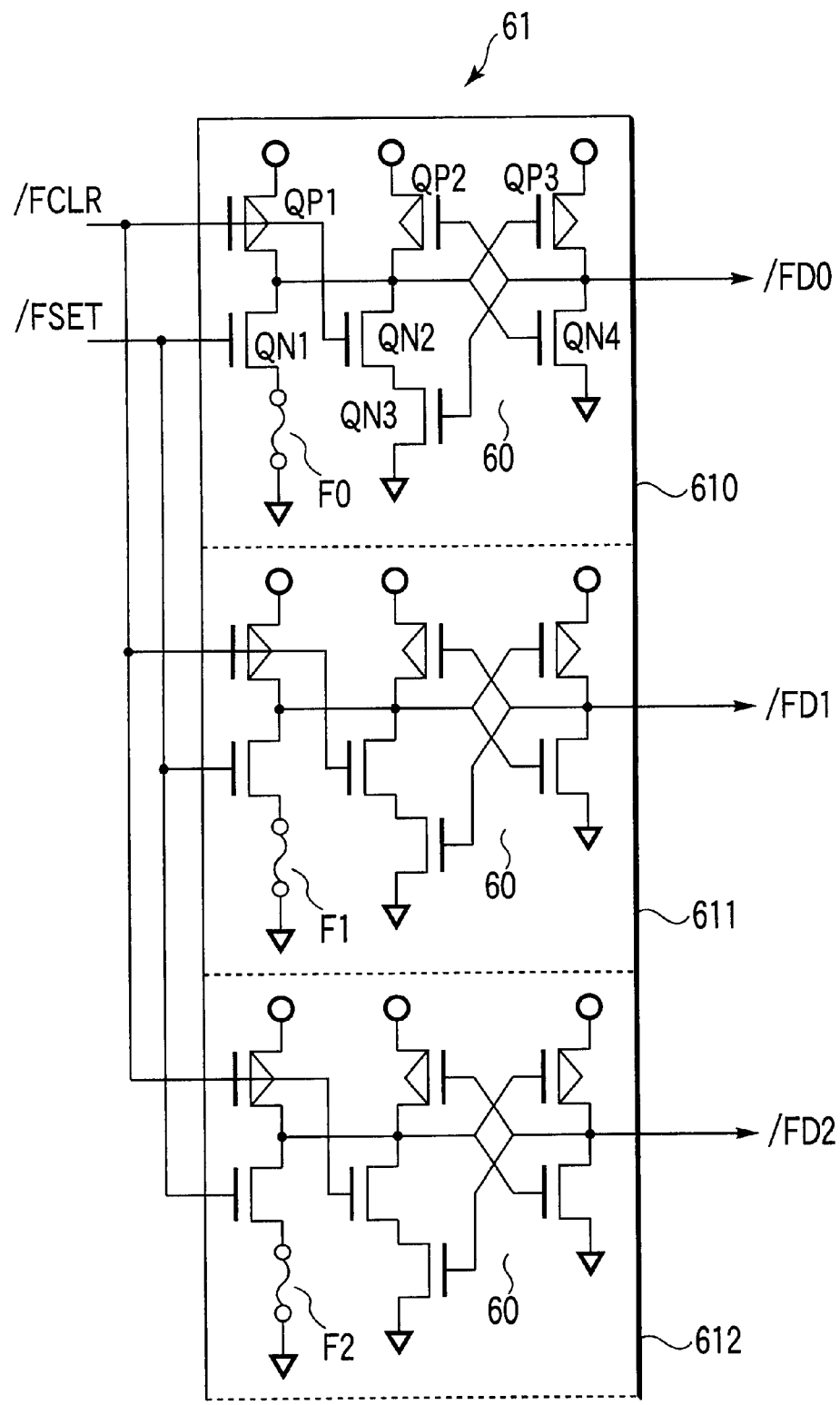
FIG. 12 is a circuit diagram showing an example of a shift indicating number holding circuit in FIG. 11.

FIG. 12 shows the circuit configuration of the shift-indicating-number holding circuit 61 in detail. The shift-indicating-number holding circuit 61 comprises fuse circuits 610 to 612 having fuse elements F0 to F2 in which the 3-bit data shift indicating numbers assigned to the corresponding I/O lines are programmed. These fuse elements may be of the laser or electric program type. They are preferably of the electric program type. The fuse circuits 610 to 612 each have a latch circuit 60 for holding data /FD0 to FD2 for the programmed fuse elements F0 to F2; latching is controlled by means of control signals /FCLR and /FSET. The configuration and operation of the fuse circuits 610 to 612 are similar to those of the fuse circuits 410 to 412 in the selection circuit 30 in FIG. 9, so detailed description thereof is omitted.

The determination circuit 62 in FIG. 11 is a kind of decode circuit which compares the 3-bit fuse data /FD0 to /FD2 (that is, the shift indicating number) from the data-shiftindicating-number holding circuit 61 with the selection signals /FD0 to /FD2 (when a defective-column address is input, these signals become a corresponding shift indicating number) transmitted from the selection circuit 30 and which outputs the shift control signal /SR="L" (or /SL="L"), indicating that the data lines to the right (or left) of the one for which the 3-bit fuse data match with the selection signals.

When the address of a normal column is input, /SL=/SR="H". That is, in the example in FIG. 8, when an address indicating that data are to be read out from the column Col1 is input, the signal /SL="L" is output to the second and following I/O lines I/O1 to I/O127 so that these I/O lines are each connected to the data line adjacent to the previously connected one with the data line DQ1 excluded from the connection.

Figure 13:
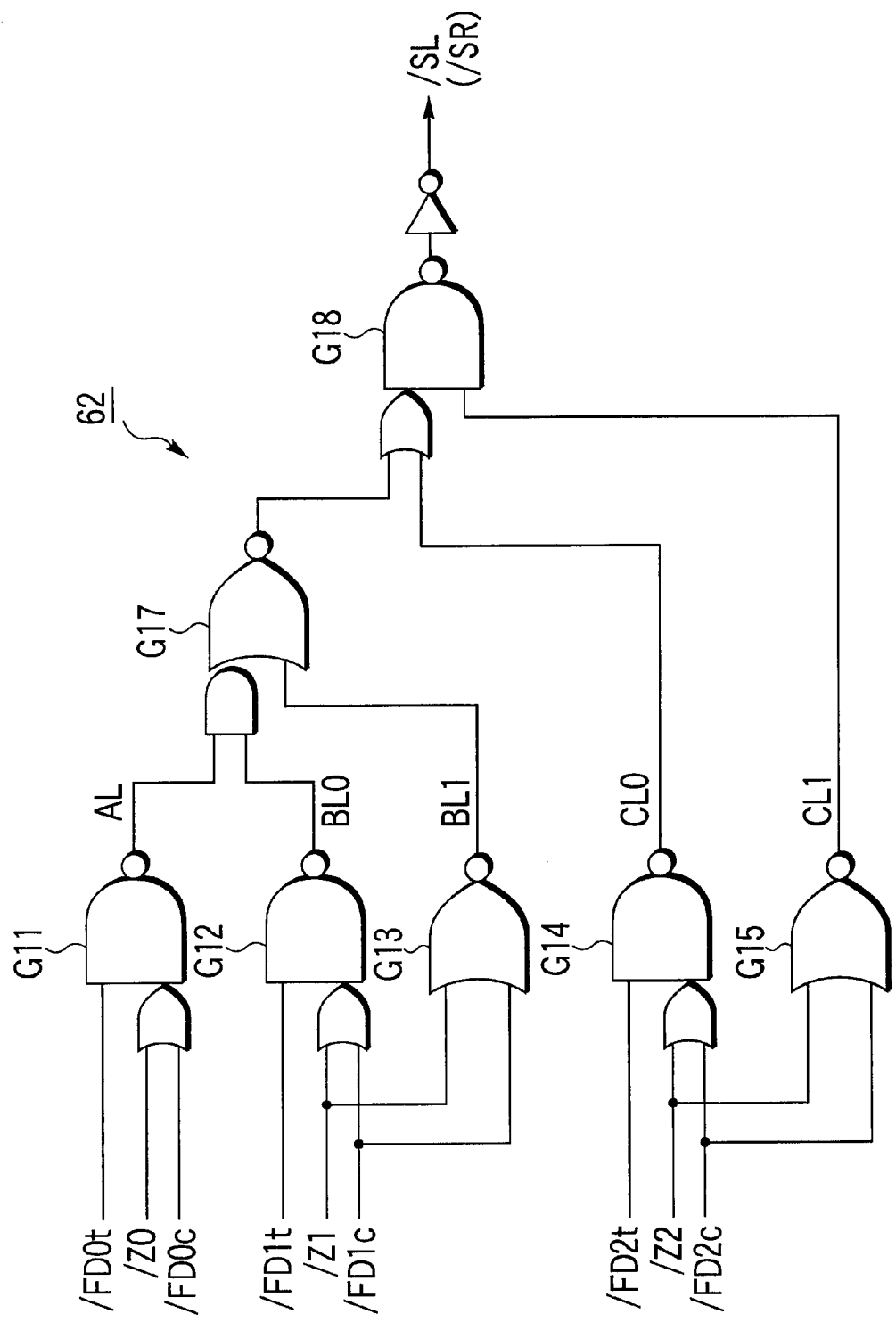
FIG. 13 is a circuit showing an example of a determination circuit in FIG. 11.

FIG. 13 shows the specific circuit configuration of the determination circuit 62 in FIG. 11. The portion of the circuit which outputs the shift control signal /SL for controlling the left shift has been extracted and show. The portion of the circuit which outputs the shift control signal /SR for controlling the right shift has a similar configuration, so description of this portion is omitted.

The determination circuit 62 compares complementary data signals /FD0t, /FD0c to /FD2t, and FD2c corresponding to the fuse data FD0 to FD2 from the data-shift-indicating-number holding circuit 61 with the selection signals Z0 to Z2 from the selection circuit 30 for each corresponding bit to determine which signals are larger or smaller. That is, the determination circuit 62 outputs the /SL="1" until the data line for which the selection signals /Z0 to /Z2 match with the fuse data /FD0 to /FD2 is reached, and outputs the signal /SL="0" for the following data lines.

Figure 14:
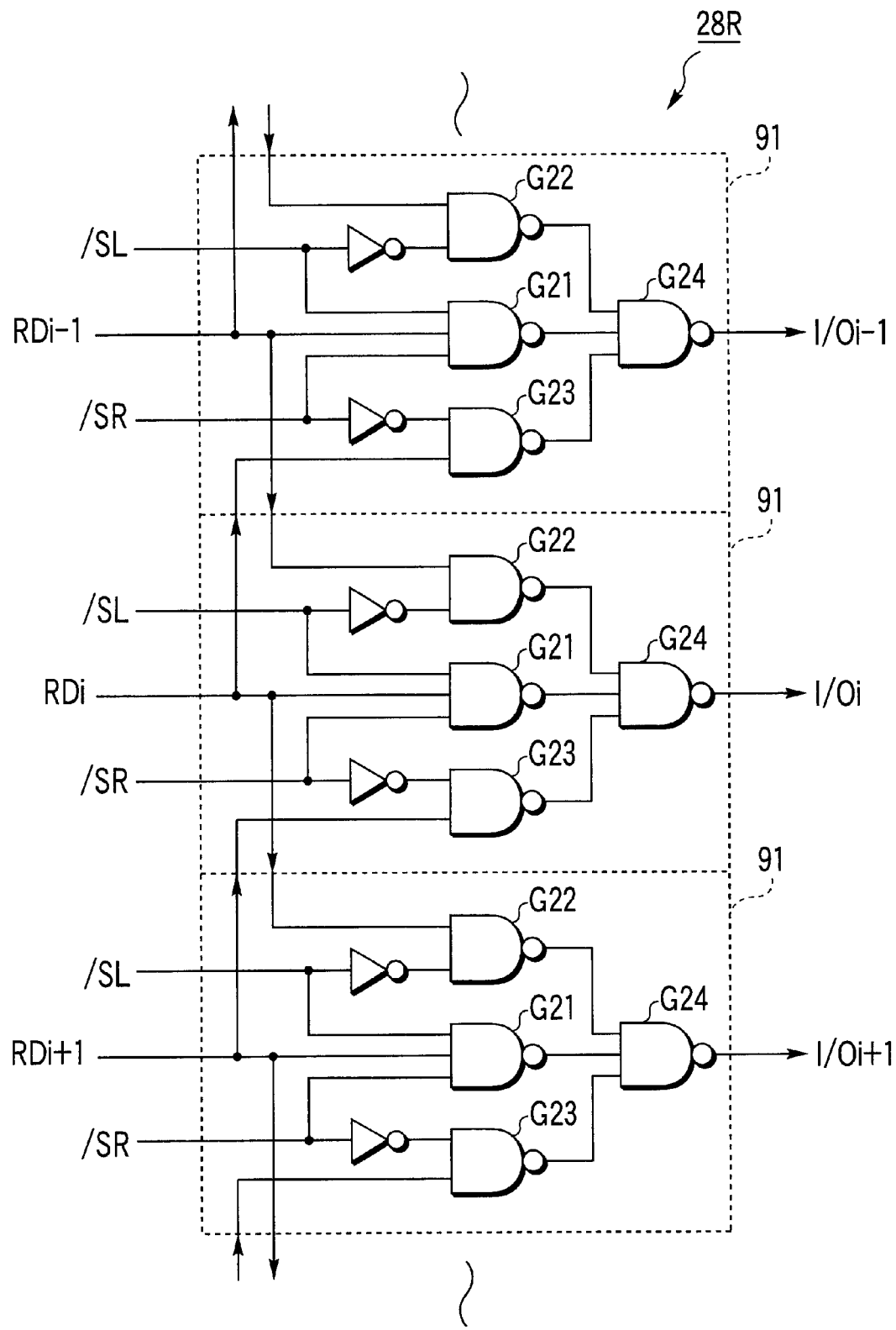
FIG. 14 is a circuit diagram showing an example in which the data line shifting circuit in FIG. 6 is configured as a readout shift circuit.
Figure 15:
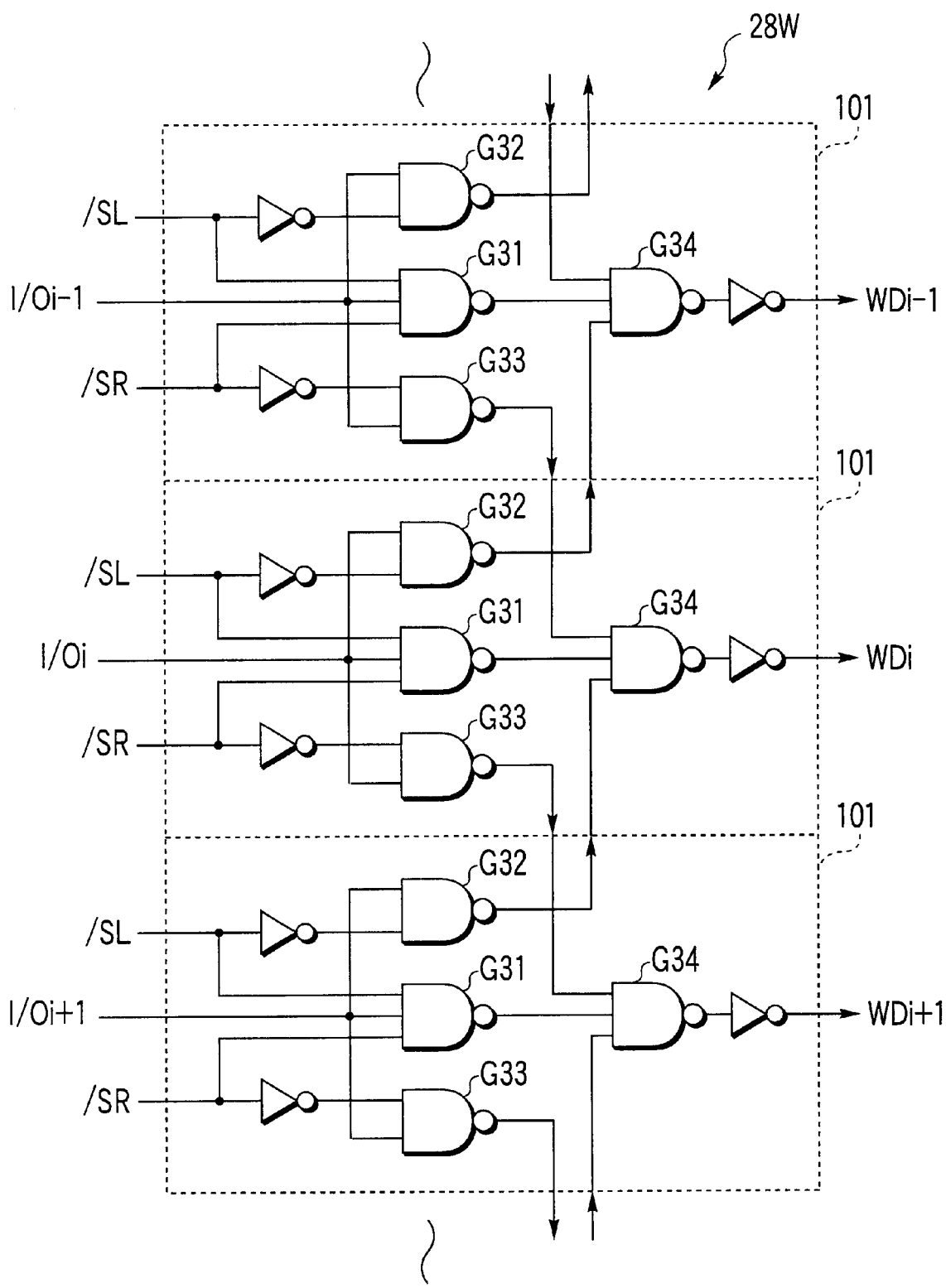
FIG. 15 is a circuit diagram showing an example in which the data line shifting circuit in FIG. 6 is configured as a write shift circuit.

The data line shifting circuit 28, controlled by means of the shift control signal /SL or /SR generated by the shift control circuit 29 as described above, is configured as a readout shifting circuit 28R for a data readout as shown in FIG. 14 and as a write shifting circuit 28W for a data write as shown in FIG. 15.

The readout shifting circuit 28R will be described. Data lines RDi each have a gate circuit 91 including NAND gates G21 to G24 and an inverter. The data on the data line RDi and the shift control signals /SL and SR for the corresponding bits are input to the NAND gate G21, and the data on the data line RDi are also input to the NAND gates G23 and G22 of the gate circuits for the adjacent data lines RDi−1 and RDi+1, respectively.

For example, the data line RDi will be focused on. When the shift control signals /SL="H" and /SR="H", the data on the data line RDi pass through the NAND gate G21 and further through the NAND gate G24 and is then output to a corresponding I/O data line I/Oi. In contrast, when the shift control signal /SL becomes "L" for the data line RDi, the output from the NAND gate G21 of the data line RDi is maintained at "H", thus opening the NAND gate G22. Thus, instead of the data on the data line RDi, the data on the adjacent data line RDi−1 pass through the NAND gate G22 and further through the NAND gate G24 and is then output to the I/O line I/Oi. That is, the data line has been shifted.

This also applies to shift control executed by the shift control signal /SR="L" for controlling the right shift.

The data write shifting circuit 28W also has a gate circuit 101 provided for each write data line WDi (omitted from FIG. 6 as described above) and including NAND gates G31 to G34 and an inverter. In this case, write data for the I/O line I/Oi and the corresponding shift control signals /SL and /SR are input to the NAND gate G31, and the same write data are also input to the NAND gates G32 and G33 in the same gate circuit 101. The NAND gates G32 and G33 are opened when the shift control signals /SL and /SR are "L" and outputs therefrom are input to the NAND gate G34 of the adjacent gate circuit.

For example, the I/O line I/Oi will be focused on. When the shift control signals /SL="H" and /SR="H", the data on the I/O line I/Oi pass through the NAND gate G31 and further through the NAND gate G34 and is then output to a corresponding data line WDi. In contrast, when the shift control signal /SL becomes "L" for the I/O line I/Oi, the output from the corresponding NAND gate G31 becomes "H", thus opening the NAND gate G32. Thus, the data on the I/O line I/Oi pass through the NAND gate G32 and through the NAND gate G34 of the adjacent gate circuit and is then output to the adjacent data line Wdi−1. That is, the data on the I/O line I/Oi are transferred to the data line WDi−1 adjacent to the data line WDi.

This also applies to shift control executed by the shift control signal /SR="L" for controlling the right shift.

A fuse circuit 61 is arranged for each I/O line as shown in FIG. 11, for holding eight (3-bit) data shift indicating numbers for each I/O line. A fuse, however, requires a large layout area on a chip. Thus, the arrangement of three fuse circuits for each I/O line involves a significant area penalty.

FIG. 16 shows a configuration that restrains the area penalty compared to the shift control circuit 29 in FIG. 11. This shift control circuit comprises a plurality of fuse elements, a fuse circuit 610 arranged outside an I/O line arrangement, for storing fuse data, and three shift registers 611 arranged at I/O line positions, for sequentially transferring and holding the fuse data.

During an initialization operation following power-on, the fuse data stored in the fuse circuit 610 are automatically read out and sequentially transferred to the shift registers 611, so that data shift indicating numbers set for the corresponding I/O lines are held as in FIG. 11.

Figure 17:
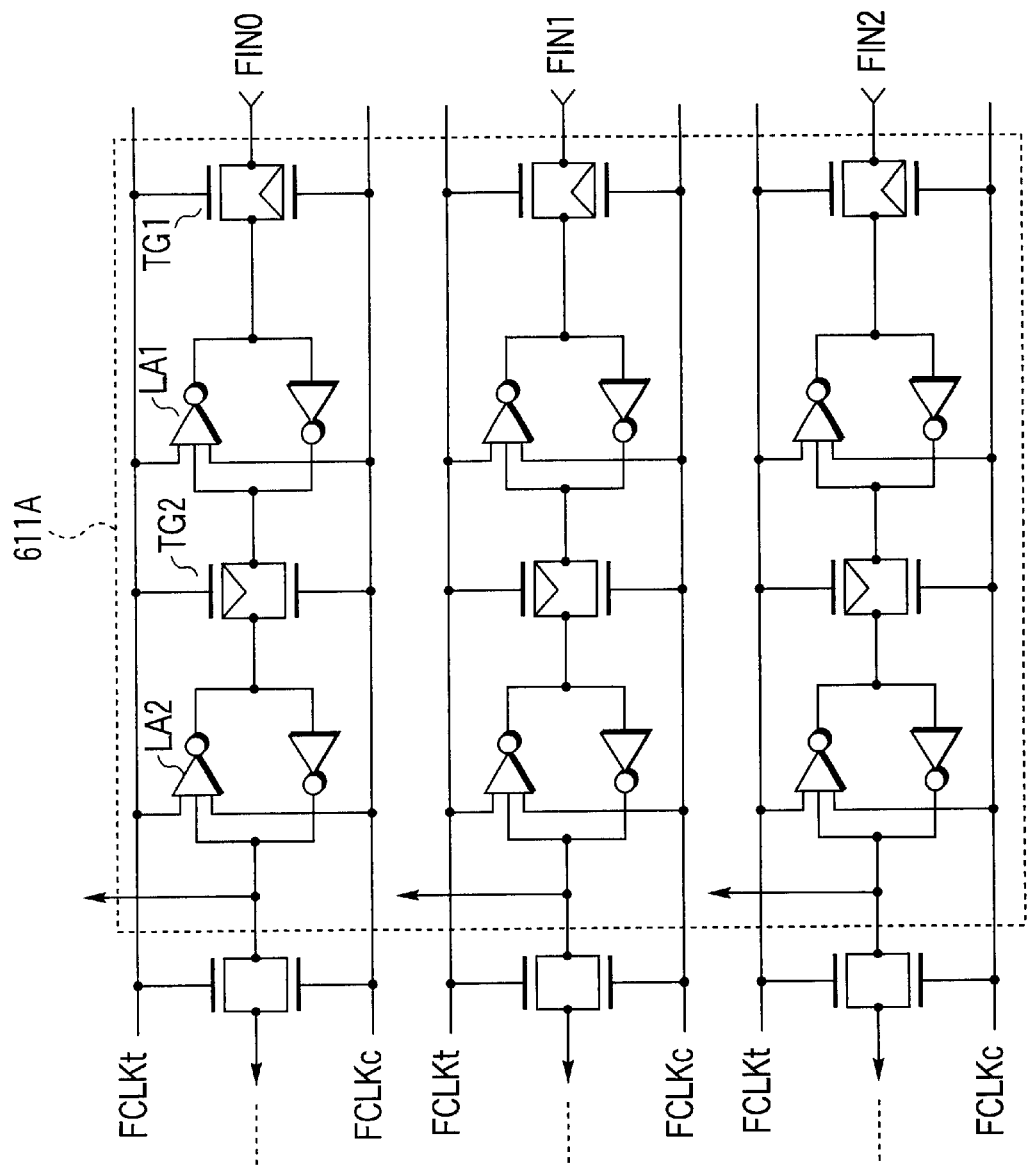
FIG. 17 is a circuit diagram showing an example of the shift register in FIG. 16.

The shift registers 611 in FIG. 16 each have three shift stages 611A arranged correspondingly to 3-bit fuse data FIN0 to FIN2 as shown in FIG. 17. The figure shows only one stage. Each shift stage 611A comprises a pair of transfer gates TG1 and TG2 alternately driven by means of complementary clock signals FCLKt and FCLKC and a pair of latch circuits LA1 and LA2 for holding data transferred by the transfer gates TG1 and TG2.

In this shift control circuit, the fuse circuit 610, requiring a large area, is arranged outside the I/O line wiring area to make it possible to reduce the area penalty associated with the fuse circuits for storing and holding the data shift indicating numbers.

Furthermore, in the above shift control circuit, the three shift stages 611A are provided for each I/O line so as to correspond to the 3-bit data shift indicating numbers, but the shift control circuit may comprise a shift register 612 having only a 1-bit shift stage for each I/O line as well as an adder 132.

The adder 132 outputs the fuse data FD0 to FD2 constituting the 3-bit data shift indicating number. In this case, the data shift indicating numbers are input to the shift registers 612 in the ascending order (in FIG. 18, the data input starts with I/O 127), so that fuse data Fp are set so as to become "1" (="H") at an I/O position where the data shift indicating number is incremented. At an I/O position where the shift register 612 has Fp="1", the adder 132 adds Fp to an output from the adder that follows in the shift direction to output a desired shift indicating number.

A data converting circuit 131 in FIG. 13 converts the 3-bit selection signal FIN (=/Z0 to /Z2), the fuse data output from the selection circuit 30 in FIG. 6, into 1-bit data that is "1" at an increment position and is "0" at the other positions. The data converting circuit 131 may comprises a comparator 131A and a counter 131B as shown in FIG. 20.

Figures 19, 20:
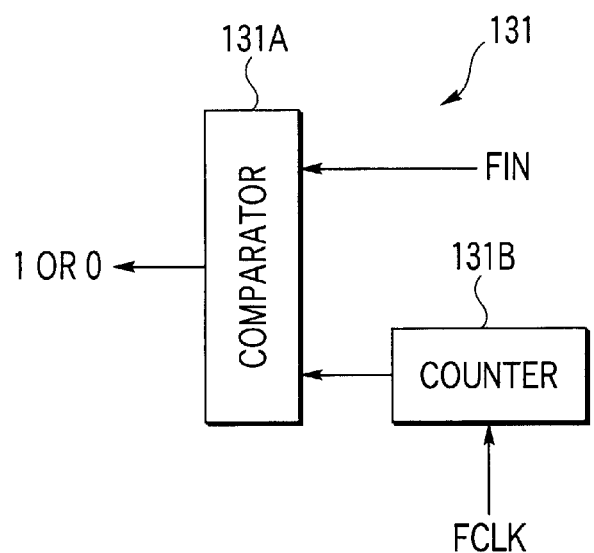
FIG. 19 is a view showing an example of data transferred and held by a shift register in FIG. 18.
FIG. 20 is a circuit diagram showing an example of a data converting circuit in FIG. 18.

As shown in FIG. 19, the data shift indicating number corresponds to the number of the I/O line and for example, increments by one at each shift start point in the ascending order. Thus, the counter 131B counts the clock signal FCLK, while the comparator 131A compares the fuse data FIN with the count value. If the data and the value are equal, "1" is set; if the count value is larger than the fuse data FIN, "0" is set. Then, as shown in FIG. 19, the fuse data Fp to be transferred to the shift register 611 become "1" at the increment position of the data shift indicating number.

Figure 18:
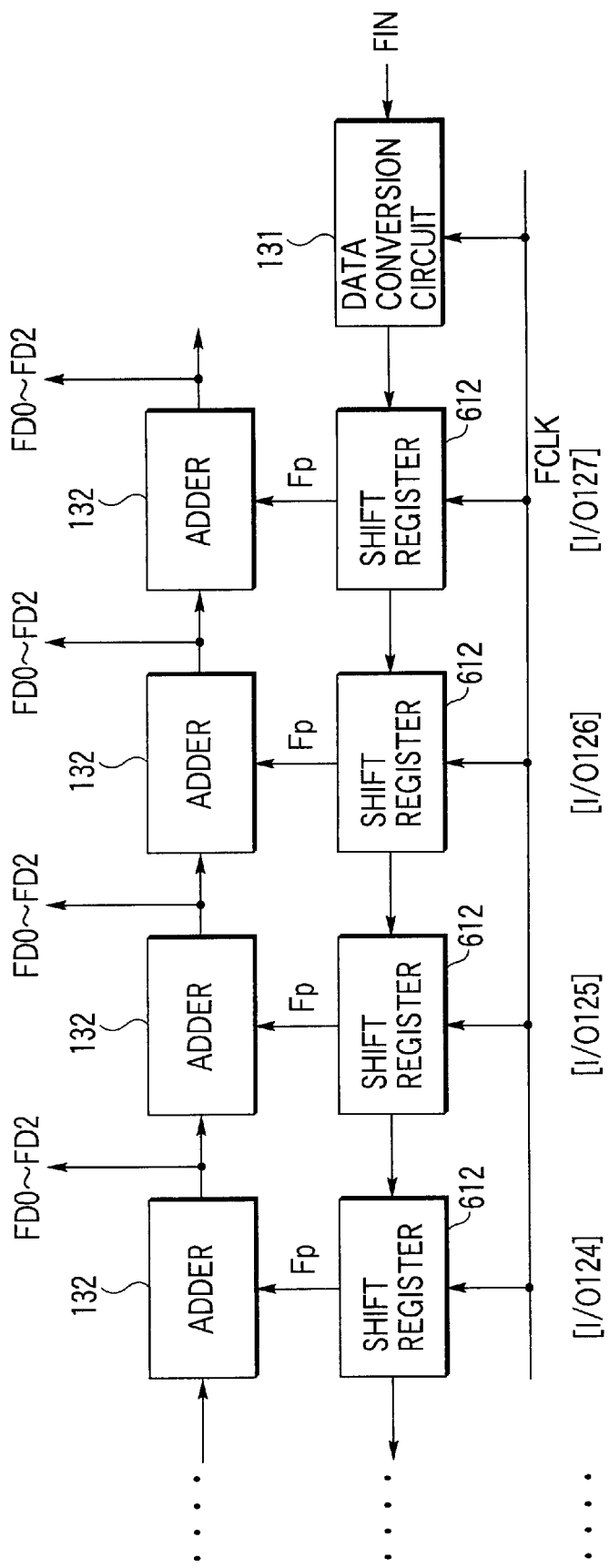
FIG. 18 is a block diagram showing yet another example of the shift control circuit in FIG. 11.
Figure 21:
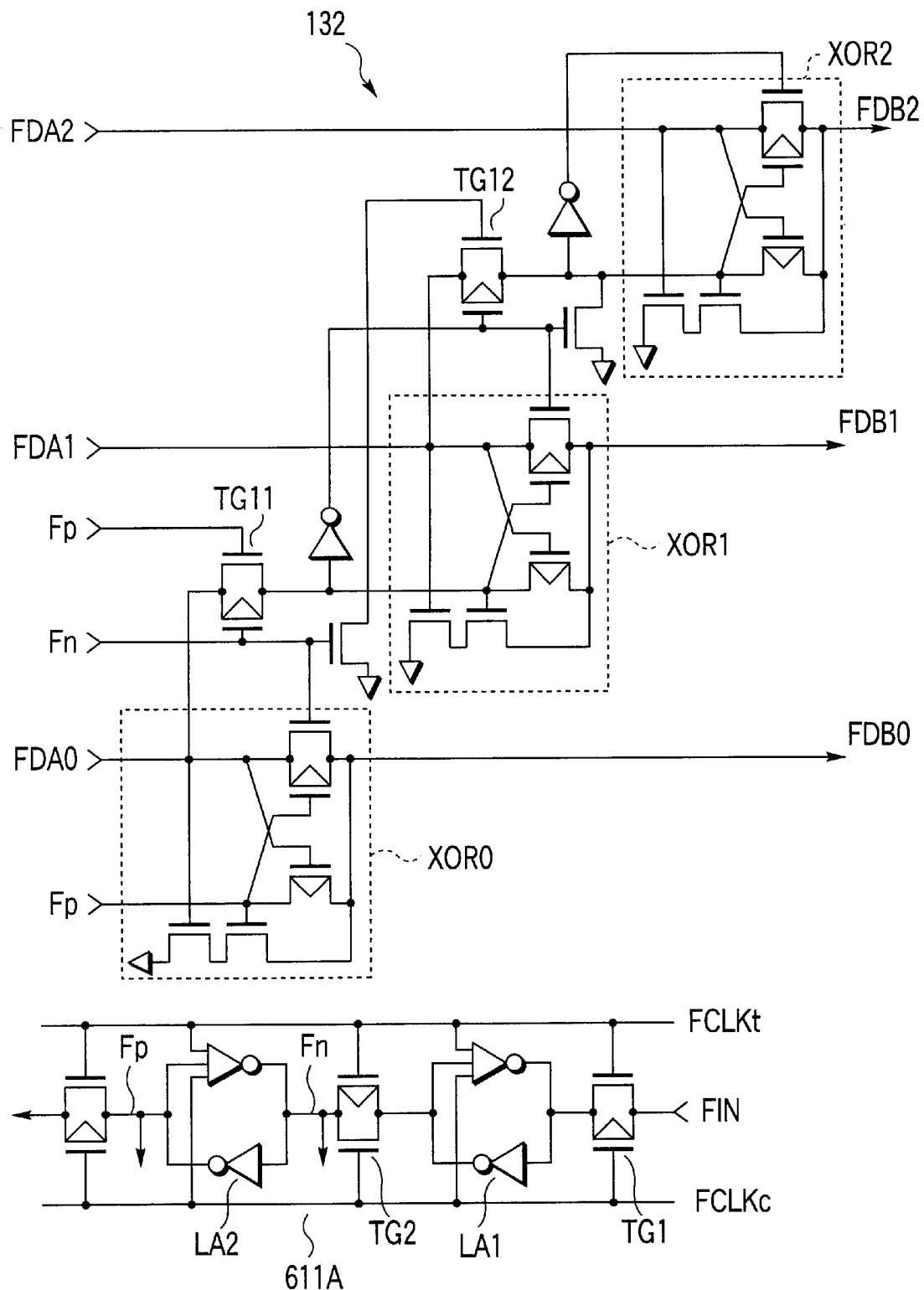
FIG. 21 is a circuit diagram showing an example of one stage of a shift control circuit in FIG. 18.

FIG. 21 shows the specific circuit configuration of the shift stage 611A and adder 132 belonging to one of the stages of the shift control circuit in FIG. 18. As in FIG. 17, the shift stage 611A comprises the pair of transfer gates TG1 and TG2 alternately driven by means of the complementary clock signals FCLKt and FCLKc and the latch circuits LA1 and LA2 for holding data transferred by the transfer gates TG1 and TG2. Further, the adder 132 comprises three exclusive OR gates XOR0 to XOR2. In the adder 132, 3-bit data from the preceding stage are denoted by FDA0 to FDA2, and output data (data FD0 to FD2 in FIG. 18) from the present stage are denoted by FDB0 to FDB2.

In the adder 132, the exclusive OR gate XOR0 receives inputs of the first-bit data FDA0 of the preceding fuse data and the data Fp from the shift stage 611A. The exclusive OR gate XOR1 receives inputs of data Fn from an input node of the latch circuit LA2 of the shift stage 611A, the first-bit data FDA0 of the fuse data from the preceding stage, and the second-bit data FDA1 of the fuse data from the preceding stage. The exclusive OR gate XOR2 receives inputs of the second- and third-bit data of the fuse data from the preceding stage via the transfer gate TG12 controlled by means of an output from the transfer gate TG11.

When Fp="0", the transfer gates TG11 and TG12 are off and the outputs FDA0 t0 FDA2 from the preceding stage pass through the exclusive OR gates XOR0 to XOR2 to become FDB0 to FDB2. At the exclusive OR gate XOR0, when either FDA0 or Fp is "1", FDB0="1". In contrast, when both FDA0 and Fp are "1", the output FDA0 passes through the transfer gate TG11 and is then input to the next exclusive OR gate XOR1, where it is added to FDA1. When incrementation is subsequently executed at the I/O position where Fp="1",as described above, the above-mentioned 3-bit fuse data are recovered.

As described above, when the 3-bit data shift indicating number is set for each data line to shift the data lines in order to relieve defective columns, even if data are simultaneously input to or output from a large number of I/O terminals, selection signal lines for shift control which are fewer than the I/O lines have only to be inserted into the I/O line area, thereby making it possible to reduce the area penalty associated with the data line shift control. Further, since the number of selection signal lines may be constant irrespective of the number of I/O lines, this embodiment is effective on multibit parallel I/O type memories such as logic mounted DRAMs.

Further, in the above description, the data shift indicating number is 0 to 7 represented by the 3 bits, but numbers represented by n (an arbitrary positive integral number) can generally be set.

Moreover, in the above description, the fuse circuit comprising an electric programming type fuse is particularly effective for reducing the pitch of the I/O lines. That is, a laser programming type fuse does not allow wires to pass over itself due to laser irradiation; the electric programming type fuse, however, allows wires to pass over itself.

As described above, data shift indicating numbers that are fewer than the I/O terminals to or from which data are simultaneously input or output are set for the corresponding data lines to shift the data lines in order to relieve defective columns, thereby making it possible to reduce the number of selection signal lines for shift control which are inserted in the I/O line area.

Figure 22:
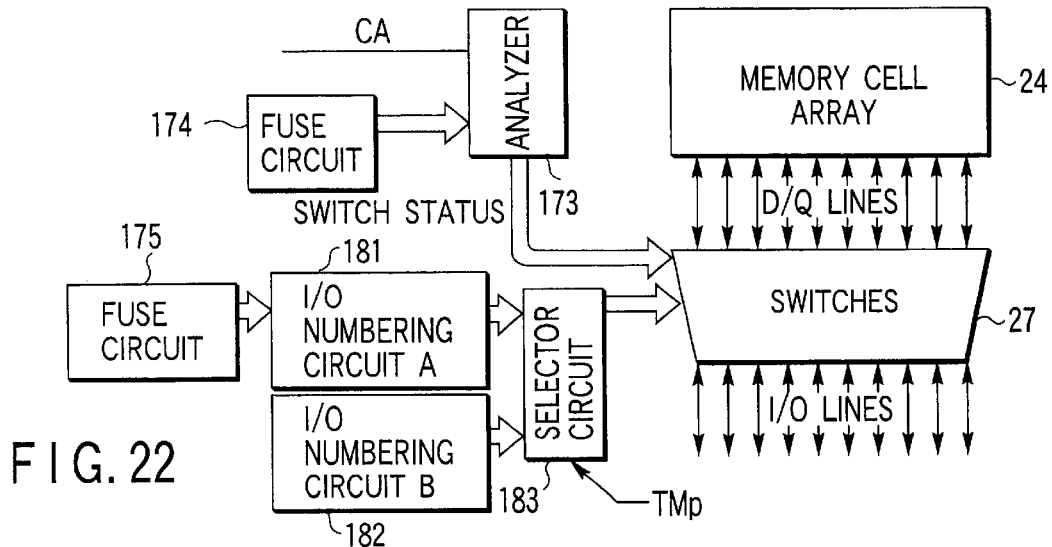
FIG. 22 is a block diagram showing the configuration of a DRAM according to a first embodiment of the present invention wherein a test mode (forced access mode) in which memory cells are forcibly accessed is added to a data line-shifting redundant circuit.

FIG. 22 is a conceptual block diagram of a DRAM according to an embodiment of the present invention wherein a forced access mode for forcibly accessing memory cells is added to the data line-shifting redundant circuit shown in FIGS. 6 to 21.

The data line-shifting redundant circuit shown in FIG. 22 has a plurality of I/O numbering circuits for providing I/O numbers for the I/O units in the multiplexor circuit 27. This example includes a first I/O numbering circuit 181 and a second I/O numbering circuit 182.

In FIG. 22, redundant column cell arrays 24A and 24B for relieving defective columns are arranged adjacent to a normal memory cell array 24 as in FIG. 6. In this case, the redundant column cell arrays 24A and 24B, in addition to a column gate circuit 25, a group of DQ sense amplifiers 26, and the like, are not illustrated. D/Q lines are used to transfer readout/write data to and from the memory cell array 24.

A multiplexor circuit 27 has a function of reconnecting connection paths between the D/Q lines and group of I/O lines for the entire memory based on the data light shifting method, and corresponds to the multiplexor circuit 27 in FIG. 6.

An analyzer 173 generates a switch status signal depending on data stored in a fuse circuit 174 and including the column address signals CA and first reconnection information (information used to determine how many data shift indicating numbers the I/O line numbers 0 to 127 are to have), and controls an operation of determining a data line-shifting start point for the I/O units in the multiplexor circuit 27 each time a column address is input. The analyzer 173 and the fuse circuit 174 correspond to the selection circuit 30 in FIG. 6.

The first I/O numbering circuit 181 outputs a first I/O number A depending on data stored in a fuse circuit 175 and including second reconnection information (information used to determine what data shift indicating number each column is to have).

The second I/O numbering circuit 182 outputs a second I/O number B for setting a status (forced disable) for forcibly disabling reconnections by the multiplexor circuit 27 or a status (forced redundancy) for forcibly enabling reconnections by the multiplexor circuit 27.

The selector circuit 183 receives outputs from the two I/O numbering circuits 181 and 182 and selects one of the outputs according to a test mode signal TMp. The output from the first I/O numbering circuit 181 is selected in the normal access mode in which the signal TMp is inactive, whereas the output from the second I/O numbering circuit 182 is selected in the forced access mode in which the signal TMp is active.

Next, the operation of the data line-shifting redundant circuit in FIG. 22 will be explained in connection with three examples: the normal access mode, the force disable mode for forcibly disabling reconnections by the multiplexor circuit 27, and the forces access mode (forced redundancy mode) for forcibly enabling reconnections by the multiplexor circuit 27.

Figure 23:
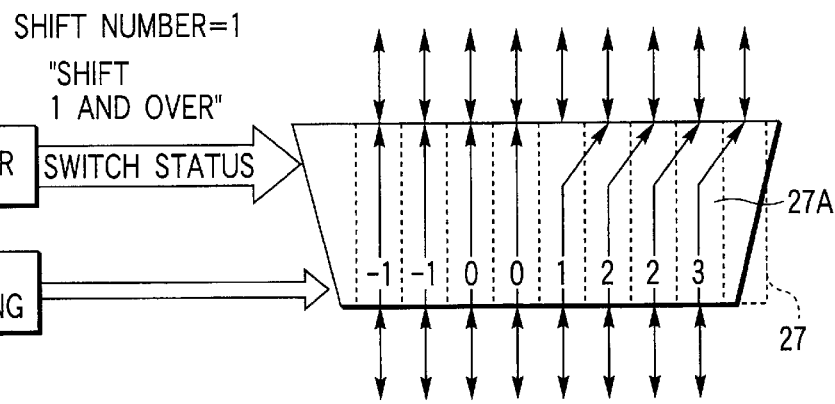
FIG. 23 is a conceptual view useful in explaining an operational state in which the data line shifting circuit in FIG. 22 is in a normal access mode.

FIG. 23 shows how the data line-shifting redundant circuit in FIG. 22 operates in the normal access mode. In this operational state, the I/O units have normal shift number values written thereto. In this example, the selector circuit 183 selects the output from the first I/O numbering circuit 181. The values of the shift numbers of the I/O units range from 0 to 3.

In this state, when the memory is accessed, the analyzer 173 generates shift numbers as switch status signals, which are then output to the I/O units in the multiplexor circuit 27.

The I/O units each compare its own I/O number with the shift number to determine which of them is larger or smaller for proper reconnection. In this example, when the analyzer 173 issues the shift number 1, four I/O units having an I/O number of 1 or more execute reconnection.

Figure 24:
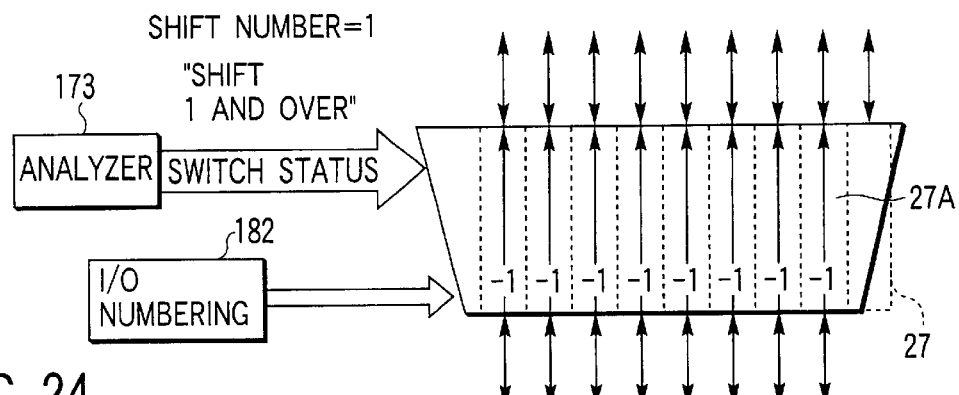
FIG. 24 is a conceptual view showing the operational state of a forced disabling mode in which reconnections by a switching circuit of the data line-shifting redundant circuit in FIG. 22 are forcibly set to a disabled status.

FIG. 24 shows the operational state of the forced disable mode for forcibly setting the disabling status for reconnections by the multiplexor circuit 27 of the data line-shifting redundant circuit in FIG. 22. This figure shows an operational state where the same memory cells as those in the normal access mode shown in FIG. 23 are accessed and where the analyzer 173 issues the shift number 1.

In this forced disable mode, the selector circuit 183 selects the output from the second I/O numbering circuit 182, and the I/O numbers of all the I/O units 27A are set to a value smaller than the varying range (0 to 3) of the shift number value, for example, −1.

In this state, when the memory is accessed and the analyzer 173 generates the shift umber 1 as the switch status signal, all the I/O units 27A having the I/O number set to −1 are prohibited from reconnection.

Figure 25:
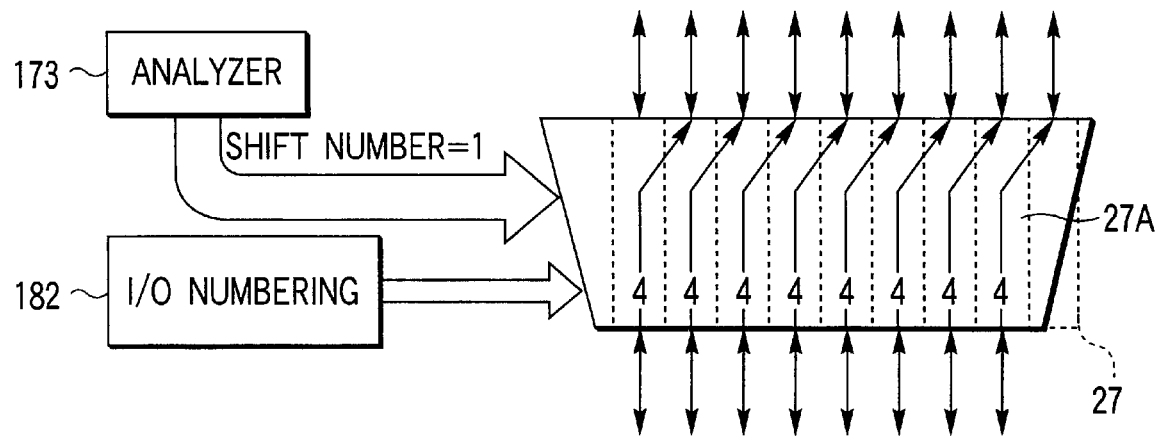
FIG. 25 is a conceptual view showing the operational state of a forced access mode (forced redundancy mode) in which reconnections by the switching circuit of the data line-shifting redundant circuit in FIG. 22 are forced.

FIG. 25 shows the operational state of the forced access mode (forced redundancy mode for enabling all redundancy) for forcibly enabling reconnections by the multiplexor circuit 27 of the data line-shifting redundant circuit in FIG. 22.

In this forced access mode, the selector circuit 183 selects the output from the second I/O numbering circuit 182, and the I/O numbers of all the I/O units are set to a value larger than the varying range (0 to 3) of the shift number value, for example, 4.

In this state, when the memory is accessed and the analyzer 173 issues the shift number 1, all the I/O units 27A execute reconnections because they have the I/O number 4.

For implementation of the above operation, a logic circuit for rewriting the I/O numbers as required is added to a location where the I/O numbers are issued, thus reducing the amount of logic circuit required at a location where the shift numbers are issued.

This makes it possible to increase the speed of reconnections between the group of I/O lines and the group of data lines and makes paths for read/write data or quickly-varying relevant signals in the forced access mode closer to those in the normal access mode.

For implementation of the forced access mode, the I/O numbers in the normal access mode are rewritten as those corresponding to the forced access mode. In this case, a non-destructive or a destructive method can be employed; the former prevents the contents of transferred I/O numbers from being destroyed in the normal access mode and the latter permits the contents of transferred I/O numbers to be destroyed in the normal access mode.

With the non-destructive method, the I/O units of the switching circuit save all or some of the I/O numbers used in the normal access mode so that these I/O numbers can be temporarily changed in the forced access mode, thereby enabling easy transition between the normal access mode and the forced access mode. Further, when locational information (I/O numbers) is assigned to the I/O units and if synchronous serial transfer, which requires a relatively long duration, is used, the application of the non-destructive method eliminates the needs for retransmission after the forced access mode has been completed.

With the destructive method, in the forced access mode, the I/O number transferring circuit used in the normal access mode is used again to transfer I/O numbers for the forced access mode.

A specific example of the shift control circuit 29 of the multiplexor circuit 27 for implementing the operations of the circuits in above-mentioned FIGS. 24 and 25 will be explained below.

Figure 26:
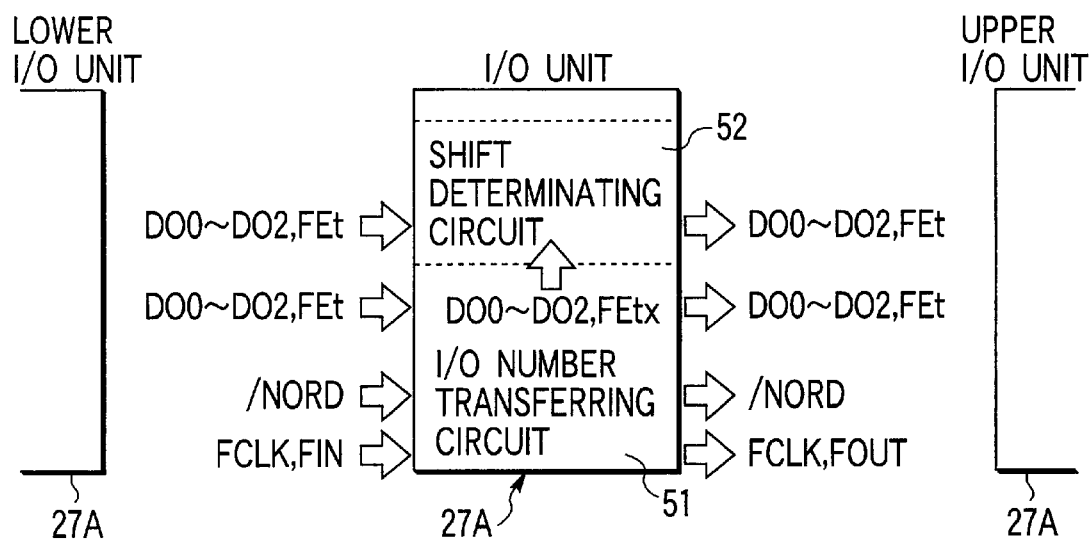
FIG. 26 is a block diagram simplifying connections between signal lines and an I/O number transferring circuit and a shift determining circuit, the signal lines being used to communicate signals between I/O units of the switching circuit of the data line-shifting redundant circuit.

In the shift control circuit 29 shown in FIG. 26, the I/O units 27A each have an I/O number transferring circuit 51 and a shift determining circuit 52 for determining whether or not the I/O lines are to be reconnected. FIG. 26 also shows various signals transmitted and received between the I/O units 27A in the multiplexor circuit 27.

The I/O number transferring circuit 51 transfers and holds the I/O numbers used in the normal access mode. The shift determining circuit 52 determines whether or not to reconnect the I/O lines.

Figure 27:
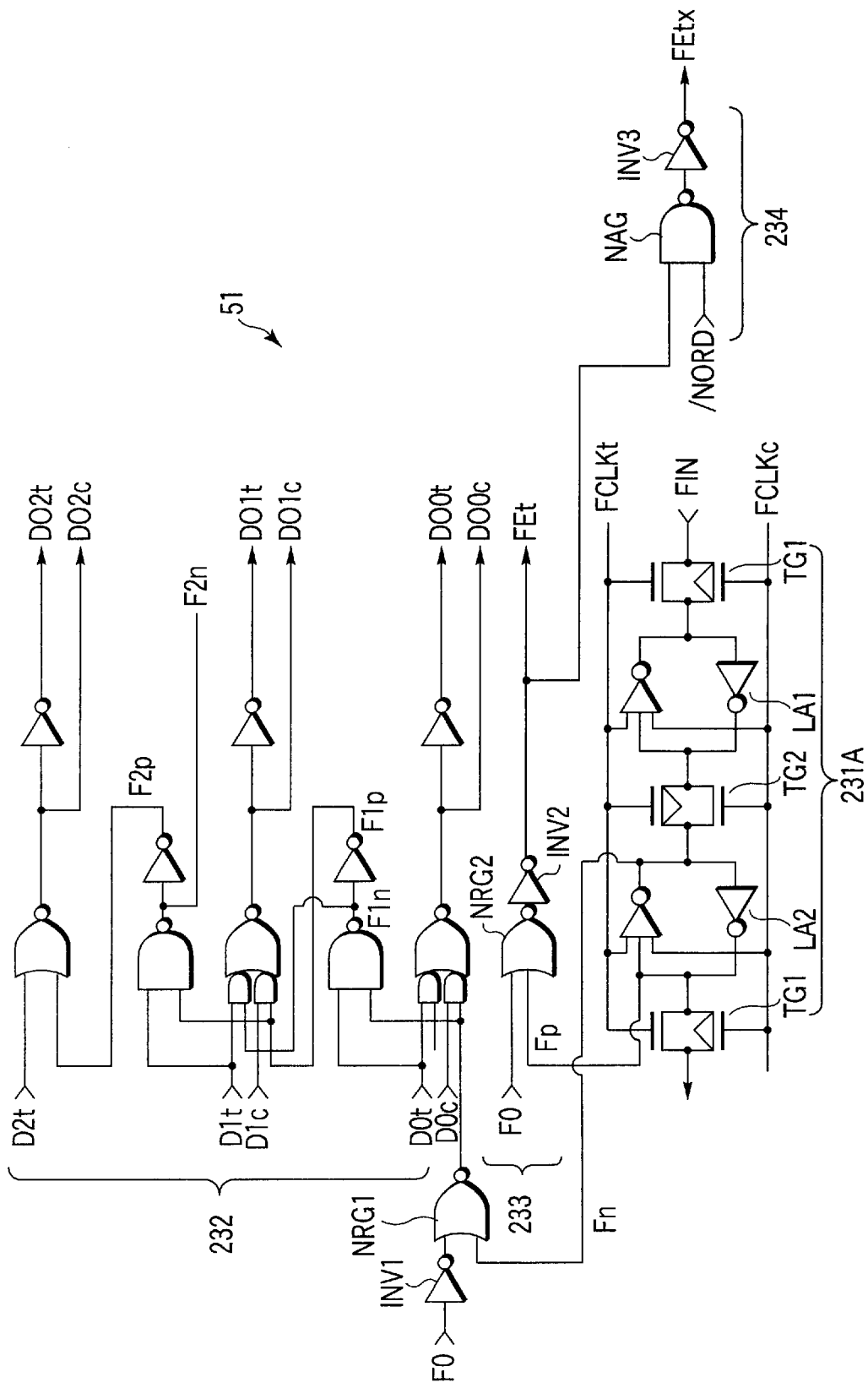
FIG. 27 is a circuit diagram showing an example of an I/O number transferring circuit of each of the I/O units in FIG. 26.

FIG. 27 shows the detailed configuration of the I/O number transferring circuit 51 of each I/O unit 27A in FIG. 26.

The I/O number transferring circuit 51 is composed of a shift register 231A, a 3-bit adder 232, a code transferring circuit 233, and a no-redundancy mode setting circuit 234. Like the shift stage 611A described previously with reference to FIG. 17, the shift register 231A comprises the transfer gates TG1 and TG2 alternately driven by means of the FCLKt and FCLKc and latch circuits LA1 and LA2 for latching outputs from the transfer gates TG1 and TG2.

Like the shift stage 611A described previously with reference to FIG. 21, the shift stage 231A holds the input signal FIN that becomes "H" at the location where the I/O number is incremented and transmits an output to the higher I/O unit as the signal FIN.

The 3-bit adder 232 has a configuration slightly different from that of the 3-bit adder 132 described previously with reference to FIG. 21, and comprises three addition circuits. Three-bit complementary data from the preceding stage are denoted by D0t to D2t, D0c to D2t, and D2c, complementary carry output data from the addition circuit for the first bit (least significant bit: LSB) are denoted by F1n and F1p, complementary carry output data from the addition circuit for the second bit are denoted by F2n and F2p, and complementary output data from the present stage, that is, signals representative of I/O numbers after transfer or recovered 3-bit fuse data are denoted by DO0t and DO0c, DO1t and DO1c, and DO2t and DO2c.

In FIG. 27, an inverter INV1 inverts a code signal OF indicating that an I/O number has been provided for one of the lower I/O units, and a NOR gate NRG1 exclusive-ORs this signal and the data Fn from the input node of the latch circuit LA2 of the shift stage 231A. Then, an output signal from the NOR gate NRG1 and the first-bit data DO0c and DO1t of the output data from the preceding state are input to the addition circuit for the LSB.

The carry output signal F1p from the LSB addition circuit and the second-bit data D1t and D1c of the output data from the preceding stage are input to the addition circuit for the second bit.

The carry output signal F2p from the second-bit addition circuit and the third-bit data D2t and D2c of the output data from the preceding stage are input to the addition circuit for the third bit, that is, the most significant bit (MSB).

The output signals DO0t, DO0c to DO2t, and DO2c from the 3-bit adder 232 are equal to the I/O output number value from the lower I/O unit plus one if the above signal FIN is "H", while the shift stage 231A is transferring I/O numbers or are equal to the I/O output number value from the lower I/O unit if the above signal FIN is "L" during the same period. The output signals DO0t, DO0c to DO2t, and DO2c representative of the I/O number value are supplied to the higher I/O unit so that the I/O number can be used to calculate an I/O number for the higher I/O unit.

A code transferring circuit 233 is composed of a NOR gate NRG2 to which the code signal F0 and the data Fp from the output node of the latch circuit LA2 of the shift stage 231A are input, and an inverter INV2 to which an output from the NOR gate NRG2 is input. An output signal FEt from the inverter INV2 which prohibits reconnections is output to the upper I/O unit as a code signal OF and is input to a no-redundancy mode setting circuit 234.

Only some I/O units arranged continuously from the lowest one have the reconnection-prohibiting signal FEt set to "L" after the I/O number has been transferred, indicating that these I/O units have the I/O number −1.

The no-redundancy setting circuit 234 is composed of a NAND gate NAG to which the reconnection-prohibiting signal FEt and a forcing signal/NORD are input and an inverter INV3 to which an output from the NAND gate NAG is input; an output from the inverter INV3 is input to the shift determining circuit 52 as a signal FEtx.

Figure 28:
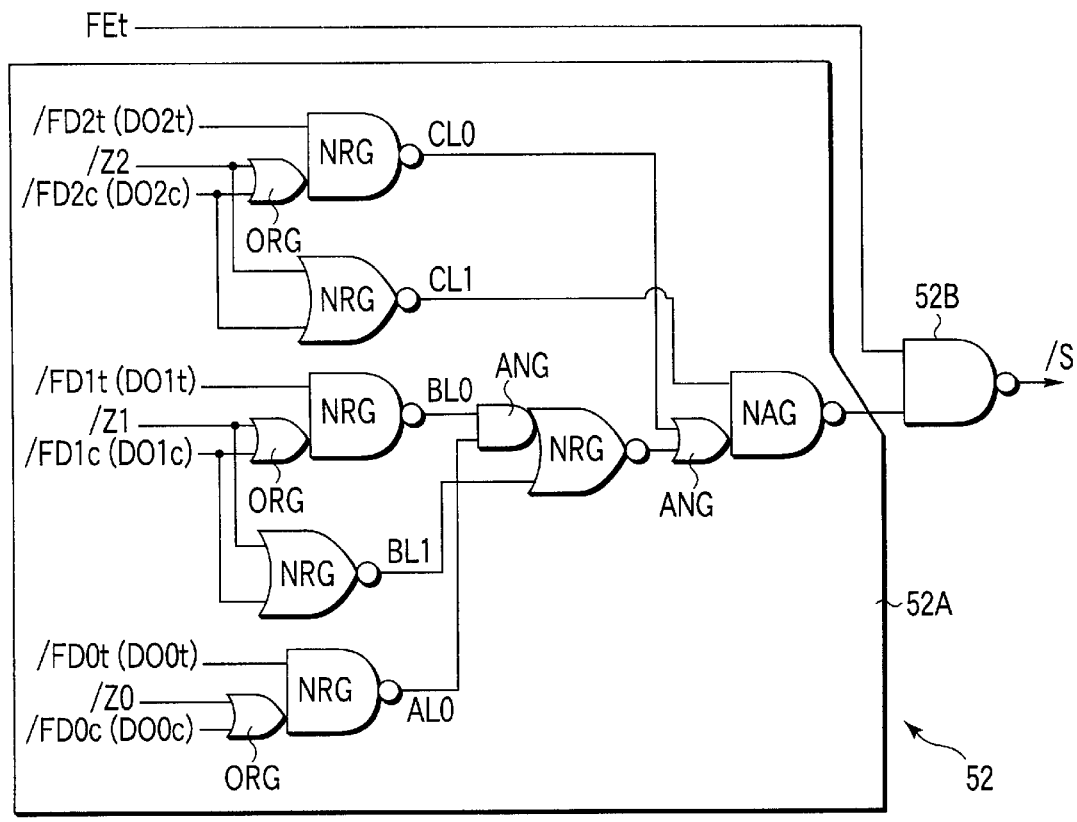
FIG. 28 is a circuit diagram showing an example of a shift determining circuit of each of the I/O units in FIG. 26.

FIG. 28 shows a shift determining circuit 52. The shift determining circuit 52 is composed of an I/O number and shift number comparing circuit 52A composed of a plurality of OR gates ORG, NOR gates, and NAND gates NAG and one AND gate ANG, and a NAND gate 52B to which an output signal from the I/O number and shift number comparing circuit 52A and the FEt (FEtx) output from the I/O number transfer circuit in FIG. 27 are input.

The I/O number and shift number comparing circuit 52A receives inputs of the complementary data signals DO0t, DO0c to DO2t, and DO2c (=FD0t, FD0c to FD2t, and FD2c) from the I/O number transferring circuit 51 in FIG. 27 which signals represent the I/O number and inputs of the shift indicating number signals /Z0 to /Z2 from the analyzer 173 in FIG. 22 which signals represent the shift status. The complementary data signals FD0t, FD0c to FD2t, and FD2t are compared with the shift indicating number signals /Z0 to /Z2 on a bit-by-bit basis to determine which signals are larger or smaller. The NAND gate 52B then exclusive-ANDs the signal FEt and results of the comparison between the shift indicating number signals /Z0 to /Z2 and the complementary data signals FD0t, FD0c to FD2t, and FD2c representative of the I/O number, and outputs a shift control signal /S representing whether the "I/O signal"=the "shift number".

Due to this operation, the shift control signal /S="1" is output from the shift determining circuits 52 corresponding to those of the I/O units 27A in FIG. 26 for which the shift indicating number signal and the I/O number are equal, while the shift control signal /S="0" is output from the shift determining circuits 52 corresponding to the following I/O units; these shift control signals are supplied to the data line shifting circuit (28 in FIG. 6).

In the above-mentioned circuits in the FIGS. 26 to 28, the circuit providing the I/O number for the forced access mode characteristic of the present invention is controlled by the code signal OF indicating that an I/O number has been provided for one of the lower I/O units of the I/O number transferring circuit 51 shown in FIG. 27 and by the forcing signal /NORD.

That is, in the forced access mode for disabling reconnections (shifts), if the forcing signal is set to "L", then in the I/O number transferring circuits 51 of all the I/O units in FIG. 26, the output signal FEtx (representative of the I/O number=−1) from the no-redundancy mode setting circuit 234 in FIG. 27 becomes "L" (set status). Then, in the shift determining circuits 52 of all the I/O units 27A in FIG. 26, the relationship of the "I/O number"≧the "shift number" is prevented from being established, and the output signal IS instructs reconnections to be prohibited. In this case, the value of the 3-bit transferred data is not destroyed. To shift to the normal access mode at the end of the forced access mode, it is only necessary to establish a state reverse to that established to enter the forced access mode, that is, to set the forcing signal/NORD to "H".

On the other hand, in the forced access mode for enabling all the reconnections (shifts), when "HH" is input as the input signal FIN to the lowest I/O unit, the signal FEt which represents the I/O number −1 and which is present continuously from the lowest I/O unit becomes "H" (disabled status) and has the I/O number 0. Furthermore, the forced access mode uses a circuit (not illustrated) for constantly zeroing the shift numbers /Z0 to /Z2 output from the analyzer 173 in FIG. 22. Then, in the shift determining circuits 51 of all the I/O units in FIG. 26, the "I/O number"≧the "shift number" is established for all accesses to the column address CA, and the output signal IS instructs reconnections to be executed. To shift to the normal access mode at the end of the forced access mode, it is only necessary to execute a procedure reverse to that used to enter the forced access mode, that is, to set the input signal FIN to the lowest I/O unit to "L", while disabling the circuit (not illustrated) for constantly zeroing the shift number. In this case, when the input signal FIN to the lowest I/O unit is set to "L", those of the I/O units which have the I/O number have the input signal FIN returned to "L".

For implementation of the described forced mode, a signal line exclusively representative of the I/O number −1 is present in wiring between the I/O number transferring circuit 51 and the shift determining circuit 52. This is because the upper limit of the varying range of the shift number value which can be represented by 3-bit data has already been reached, that is, eight shift number values have already been used, resulting in the needs for a new wire representative of the I/O number −1. The method described below, however, eliminates the needs for this. That is, the shift numbers are provided with a space corresponding to the forced access mode so as to vary, for example, from 1 to 6. Assigning the I/O number 0 to all the I/O units enables all the reconnections, and the I/O number 7 similarly disables all the reconnections.

In the above described example, in the implementation of the forced access mode, the I/O numbers used in the normal access mode are rewritten, but the transferred contents of the I/O numbers used in the normal access mode are not destroyed. The I/O units each save, for the forced access mode, all or some of the I/O numbers used in the normal access mode. That is, the forcing signal /NORD is used to control the enabling/disabling of the signal FEt for prohibiting reconnections, in other words, the disabling/enabling of reconnections, and no transferred data are not destroyed. Further, the forced access mode uses the method of temporarily changing the I/O numbers, to facilitate mutual shifting between the normal access mode and the forced access mode.

Contrary to the above, however, the forced access mode can be implemented using the method for permitting the destruction of the transferred contents of the I/O numbers used in the normal access mode. That is, the I/O numbers used in the forced access mode may be transferred again by using, for example, a configuration such as that shown in FIG. 29 as well as the I/O number transferring circuit for the normal access mode shown in FIG. 27.

Figure 29:
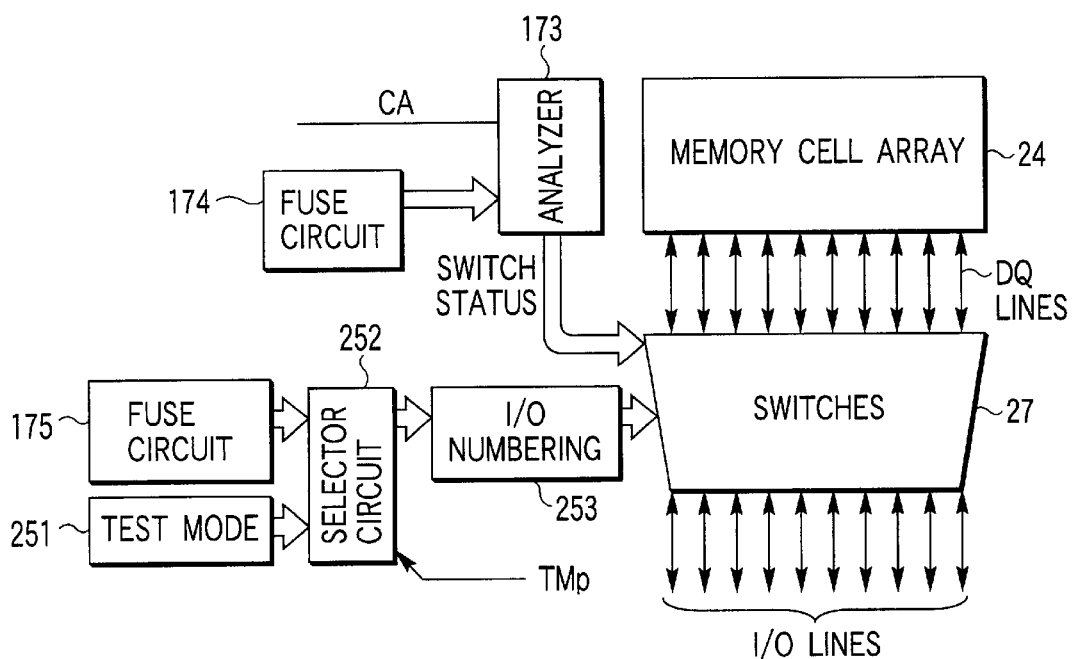
FIG. 29 is a block diagram showing the configuration of a DRAM according to an embodiment of the present invention wherein the test mode (forced access mode) in which memory cells are forcibly accessed is added to the data line-shifting redundant circuit.

The circuit in FIG. 29 is configured so that before shifting to the forced access mode, the test mode signal TMp causes a selector circuit 252 to select a test signal from a test mode circuit 251 and input the selected output to an I/O numbering circuit 253, which then issues the I/O numbers. In this case, the I/O number can be changed from −1 to 0 simply by inputting "H" to the FIN for the lowest circuit. In FIG. 29, the same parts as those in FIG. 22 are denoted by the same reference numerals.

The data line-shifting redundant circuit shown in FIG. 29 obviates the need to wire the forcing signal /NORD, which is indicative of the forced access mode as shown in FIG. 26, through each of the I/O units 27A. This circuit can also avoid causing the quickly-varying signal FETX to pass, in the forced access mode, along a signal path different from that in the normal access mode.

As described above, the semiconductor memory device of the present invention comprises the improved data line-shifting redundant circuit that can reduce the varying range of the shift number value and the number of wires for transmitting the switch status signal to the I/O units, that is, wires for relieving defective columns. If the forced access mode for forcibly accessing memory cells regardless of the output from the fuse circuit having the reconnection information is added to the circuit, plural pieces of information on the locations of the I/O units of the multiplexor circuit for switching the data lines are switched so as to set desired locational information for the I/O units. This serves to restrain a decrease in the speed at which memory cells are accessed in the normal access mode.

In describing the above embodiment, reference was made to the case where the present invention was applied to the defect relief based on the column shift redundancy. However, the present invention is applicable to any type of defect relieve system other than that based on the column shift redundancy. In the following descriptions, reference will be made to the case where the present invention is applied to a semiconductor memory device comprising redundancy word lines and redundancy bit lines.

Figure 30:
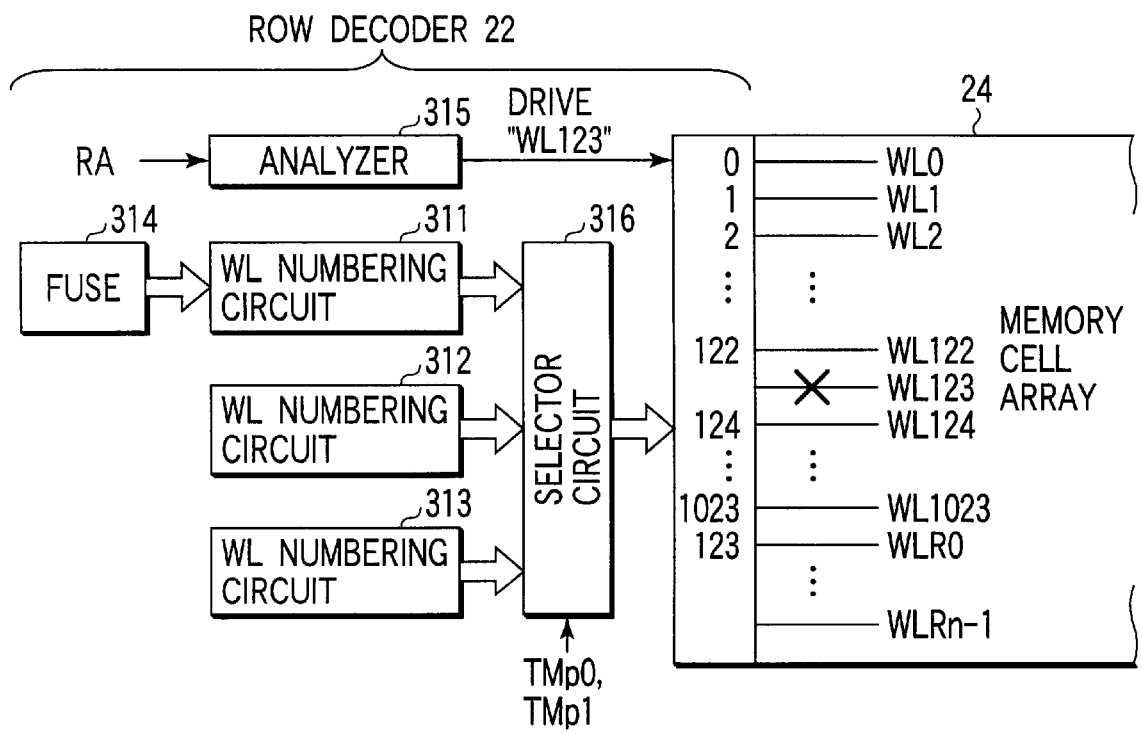
FIG. 30 is a block diagram schematically showing the configuration of a DRAM according to a second embodiment of the present invention.

FIG. 30 is a block circuit diagram showing the semiconductor memory device according to the second embodiment of the present invention. In FIG. 30, the row decoder 22 and the memory cell array 24, both depicted in FIG. 6, are illustrated.

In general, word lines WL (WL0 to WL1023) and redundancy word lines WLR (WLR0 to RLRn−1) are assigned with their peculiar numbers. In the present invention, different numbers can be assigned by use of three WL numbering circuits 311 to 313.

Referring to FIG. 30, a fuse circuit 314 stores addresses of defective word lines. An output from this fuse circuit 314 is supplied to the WL numbering circuit 311. An analyzer 315, which corresponds to the analyzer 173 shown in FIG. 22, issues a number representing the word line to be driven. The number is issued in accordance with an input row address RA. Let us assume that word line WL123 is a defective word line, as shown in FIG. 30. In this case, the WL numbering circuit 311 does not assign a number to that defective word line WL123 but assigns "123" to redundancy word line WLR0. When the row address RA corresponding to the defective word line WL123 is supplied to the analyzer 315, the row decoder 22 drives the redundancy word line WLR0 instead of the defective word line WL123.

Figure 31A:
FIGS. 31A and 31B are views useful in explaining functions of assigning WL numbering circuits in FIG. 30.
Figure 31B:

When non-redundancy word lines WL (WL0 to WL1023) are tested, WL numbering circuit 312 issues word line numbers, as shown in FIG. 31A. When redundancy word lines WLR (WLR0 to WLRn−1) are tested, WL numbering circuit 313 issues word line numbers in such a manner as to include the redundancy word lines WLR (WLR0 to WLRn−1), as shown in FIG. 31B. Outputs from the three WL numbering circuits 311 to 313 are switched from one to another by a selector circuit 316 on the basis of two-bit control signals TMp0 and TMp1.

The second embodiment is advantageous in that the rate-determining section in the ordinary operation mode is the same as that in the test mode, and yet a decrease in the access speed in the two modes is not incurred.

Figure 32:
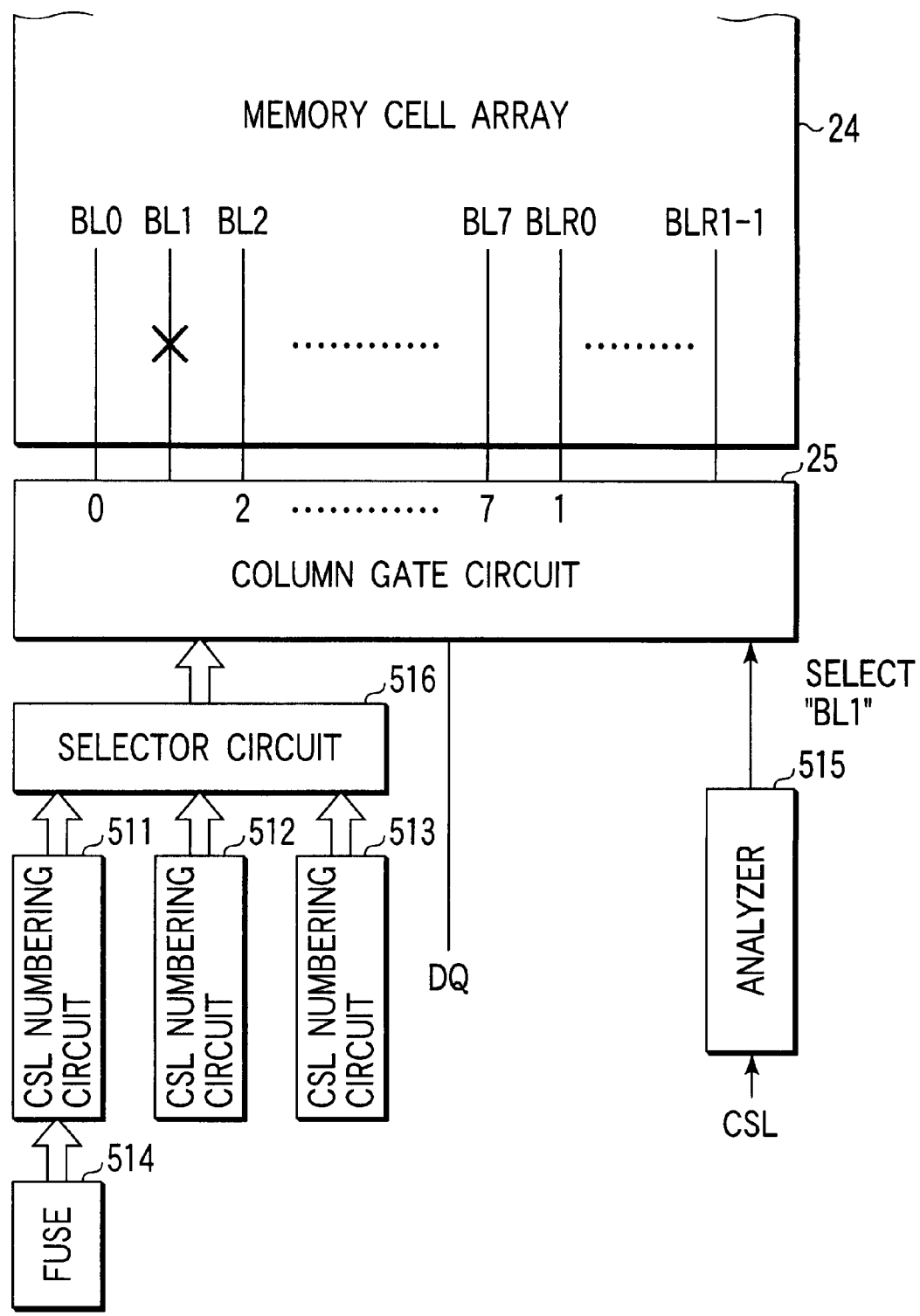
FIG. 32 is a block diagram schematically showing the configuration of a DRAM according to a third embodiment of the present invention.

FIG. 32 is a block circuit diagram showing a semiconductor memory device according to the third embodiment of the present invention. In FIG. 32, the column gate circuit 25 and the memory cell array 24, both depicted in FIG. 6, are illustrated.

In general, bit lines BL (BL0 to BL7) and redundancy bit lines BLR (BLR0 to BLRl−1) are assigned with their peculiar numbers. In the present invention, different numbers can be assigned by use of three CSL numbering circuits 511 to 513.

Referring to FIG. 32, a FUSE circuit 514, corresponding to the fuse circuit shown in FIG. 30, stores addresses of defective bit lines. An analyzer 515, which corresponds to the analyzer 315 shown in FIG. 30, issues a number representing the bit line to be selected. The number is issued in accordance with an input column select signal CSL. Let us assume that bit line BL1 is a defective bit line, as shown in FIG. 32. In this case, the CSL numbering circuit 511 does not assign a number to that defective bit line BL1 but assigns "1" to redundancy bit line BLR0. When the column select signal CSL corresponding to the defective bit line BL1 is supplied to the analyzer 515, the column gate circuit 25 selects redundancy bit line BLR0 instead of the defective bit line BL1, and connects it to data line DQ.

When non-redundancy bit lines BL (BL0 to BL7) are tested, the CSL numbering circuit 512 issues numbers of bit line BL (BL0 to BL7). When redundancy bit lines BLR (BLR0 to BLRl−1) are tested, the CSL numbering circuit 513 issues numbers of the redundancy bit lines BLR (BLR0 to BLRl−1). Outputs from the three CSL numbering circuits 511 to 513 are switched from one to another by a selector circuit 516.

In this embodiment as well, the rate-determining section in the ordinary operation mode is the same as that in the test mode, and yet a decrease in the access speed in the two modes is not incurred.

The present invention is not limited to the above described DRAMs but is also applicable to other semiconductor memories such as SRAMs and EEPROMs.

Further, the semiconductor memory device according to the present invention enables transferred data to be switched to another data. In this case, defective memory cells can be relieved using data stored in memory elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array including memory cells arranged in a matrix and having a plurality of columns;

at least one redundant column cell array provided adjacent to said memory cell array, for relieving defective columns in said memory cell array;

a plurality of data lines for transferring readout data read out from said memory cell array or write data to be written to said memory cell array;

at least one spare data line provided adjacent to the plurality of data lines, for transferring readout data read out from said redundant column cell array or write data to be written to said redundant column cell array;

a plurality of I/O lines provided correspondingly to said plurality of data lines, for transmitting and receiving readout/write data to and from said plurality of data lines;

a data line-shifting circuit for receiving a shift control signal and controlling connections between said plurality of I/O lines and both said plurality of data lines and said at least one spare data line based on said shift control signal;

a first I/O number generating circuit for generating, as locational information assigned to each of said plurality of I/O lines, shift indicating numbers that increment by one for each of a plurality of I/O lines starting with said I/O line corresponding to said data line to transfer data on a defective one of said plurality of columns, the plurality of I/O lines including said I/O line and arranged on one side relative to said I/O line;

a second I/O number generating circuit for generating shift indicating numbers all having the same value, as locational information assigned to each of said plurality of I/O lines;

a shift indicating number selecting circuit for selecting shift indicating numbers generated by said first and second I/O number generating circuits;

a shift indicating number memory circuit for storing said shift indicating numbers selected by said shift indicating number selecting circuit;

a selection circuit for storing a correlationship between addresses of said defective columns and said shift indicating numbers and outputting a selection signal corresponding to said shift indicating numbers when said address of said defective column is input; and a shift control circuit for receiving inputs of said selection signal output from said selection circuit and said shift indicating signal stored in said shift indicating number memory circuit and comparing said selection signal and said shift indicating number together to output said shift control signal to said data line-shifting circuit based on a result of said comparison, wherein if said shift indicating number selecting circuit selects the shift indicating number generated by said first I/O number generating circuit, said data line shifting circuit receives the shift control signal output from said shift control circuit and performs a first connection control operation of excluding said data line to transfer data on said defective column to sequentially shift a plurality of data lines adjacent to the excluded data line on one side thereof before correspondingly connecting the shifted data lines and said at least one spare data line to said plurality of I/O lines.

2. The semiconductor memory device according to claim 1, wherein when said shift control signal is output from said shift control circuit to said data line shifting circuit based on the result of the comparison with said selection signal, said second I/O number generating circuit generates a shift indicating number corresponding to a forced disable mode for disabling said first connection control operation by said data line shifting circuit.

3. The semiconductor memory device according to claim 1, wherein when said shift control signal is output from said shift control circuit to said data line shifting circuit based on the result of the comparison with said selection signal, said second I/O number generating circuit generates a shift indicating number corresponding to a forced access mode for causing said data line shifting circuit to sequentially shift all of said plurality of data lines before correspondingly connecting the shifted data line and said at least one spare data line to said plurality of I/O lines.

4. The semiconductor memory device according to claim 1, wherein said shift indicating number selecting circuit selects said shift indicating number generated by said second I/O number generating circuit without destroying said shift indicating number generated by said first I/O number generating circuit.

5. The semiconductor memory device according to claim 4, wherein said first I/O number generating circuit includes a data serial transferring circuit.

6. A semiconductor memory device according to claim 1, wherein said shift indicating number memory circuit has a plurality of holding circuits which hold the shift indicating numbers as fuse data, and said shift control circuit has a plurality of determination circuits which receive and compare each of the shift indicating numbers held by said plurality of holding circuits and the selection signal output from said selection circuit and output said shift control signal based on a comparison result.

7. A semiconductor memory device according to claim 1, wherein said shift indicating number memory circuit has a fuse circuit which holds the shift indicating numbers as fuse data, and a plurality of multiple-bit shift registers connected to said fuse circuit in series so that the shift indicating numbers held in said fuse circuit are transferred sequentially to said plurality of shift registers, each holding a different shift indicating number of said shift indicating numbers, and said shift control circuit has a plurality of determination circuits which receive and compare each of the shift indicating numbers held in said plurality of holding circuits and the selection signal output from said selection circuit and output said shift control signal based on a comparison result.

8. A semiconductor memory device according to claim 1, wherein said shift indicating number memory circuit has a plurality of 1-bit shift registers connected in series so that data corresponding to said plurality of shift indicating numbers are transferred sequentially to said plurality of 1-bit shift registers, each holding 1 bit of data corresponding to a different shift indicating number of said shift indicating numbers, and a plurality of adders provided correspondingly to said plurality of 1-bit shift registers, which add bits of data held in corresponding 1-bit shift registers of said plurality of 1-bit shift registers and generate different shift indicating numbers.

9. A semiconductor memory device comprising:

a memory cell array including memory cells arranged in a matrix and having a plurality of columns;

at least one redundant column cell array provided adjacent to said memory cell array, for relieving defective columns in said memory cell array;

a plurality of data lines for transferring readout data read out from said memory cell array or write data to be written to said memory cell array;

at least one spare data line provided adjacent to said plurality of data lines, for transferring readout data read out from said redundant column cell array or write data to be written to said redundant column cell array;

a plurality of I/O lines provided correspondingly to said plurality of data lines, for transmitting and receiving readout/write data to and from said plurality of data lines;

a data line shifting circuit for receiving a shift control signal and controlling connections between said plurality of I/O lines and both said plurality of data lines and said at least one spare data line based on the shift control signal;

an I/O number generating circuit for generating, as locational information assigned to each of said plurality of I/O lines, shift indicating numbers that increment by one for each of a plurality of I/O line starting with said I/O line corresponding to said data line to transfer data on a defective one of said plurality of columns, the plurality of I/O lines including said I/O line and arranged on one side relative to said I/O line;

a shift indicating number modifying circuit for modifying all said shift indicating numbers generated by said I/O number generating circuit so as to have the same value;

a selection circuit for storing a correlationship between addresses of said defective columns and said shift indicating numbers and outputting a selection signal corresponding to said shift indicating numbers when said address of said defective column is input; and a shift control circuit for receiving inputs of said selection signal output from said selection circuit and said shift indicating signal stored in said shift indicating number memory circuit and comparing said selection signal and said shift indicating number together to output said shift control signal to said data line shifting circuit based on a result of said comparison, wherein if said shift indicating number modifying circuit does not modify said shift indicating number, said data line shifting circuit receives the shift control signal output from said shift control circuit and performs a first connection control operation of excluding said data line to transfer data on said defective column to sequentially shift a plurality of data lines adjacent to said excluded data line on one side thereof before correspondingly connecting the shifted data lines and said at least one spare data line to said plurality of I/O lines.

10. A semiconductor memory device according to claim 9, wherein said shift indicating number modifying circuit modifies all said shift indicating numbers so as to have the same value, according to a forced disable mode for disabling said first connection control operation by said data line shifting circuit.

11. A semiconductor memory device according to claim 9, wherein said shift indicating number modifying circuit modifies all said shift indicating numbers so as to have the same value, according to a forced access mode for causing said data line shifting circuit to sequentially shift all of said plurality of data lines before correspondingly connecting the shifted data line and said at least one spare data line to said plurality of I/O lines.

12. A semiconductor memory device according to claim 9, wherein said I/O number generating circuit includes:

a memory circuit in which data to be stored are programmed;

a transfer circuit for transferring the data programmed in said memory circuit; and a comparison circuit for comparing the data transferred from said transfer circuit with other data, wherein said shift indicating number modifying circuit modifies the data transferred by said transfer circuit.

13. A semiconductor memory device comprising:

a memory cell array including normal memory cells and redundancy memory cells;

a comparison circuit for comparing information input for addressing the memory cell array with information identifying a defective portion of the memory cell array;

a first number generating circuit for assigning different numbers to a plurality of select lines which are used for selecting the normal memory cell and the redundancy memory cells in units of a predetermined number of cells;

at least one second number generating circuit for assigning numbers, which are different from the numbers assigned by the first number generating circuit, to the select lines; and a driving circuit for driving the select lines based on the numbers assigned by the first or second number generating circuits and a comparison result output from the comparison circuit.

14. A semiconductor memory device comprising:

a memory cell array including normal memory cells and redundancy memory cells;

a plurality of word lines connected to the normal memory cells;

a plurality of redundancy word lines connected to the redundancy memory cells;

a comparison circuit for comparing information input for selecting the word lines with information identifying a defective word line which, if any, is included among the word lines;

a first number generating circuit for assigning different numbers to the word lines and the redundancy word lines;

at least one second number generating circuit for assigning numbers, which are different from the numbers assigned by the first number generating circuit, to the word lines and redundancy word lines; and a driving circuit for driving the word lines and redundancy word lines based on the numbers assigned by the first or second number generating circuits and a comparison result output from the comparison circuit.

15. A semiconductor memory device comprising:
a memory cell array including normal memory cells and redundancy memory cells;
a plurality of bit lines connected to the normal memory cells;
a plurality of redundancy bit lines connected to the redundancy memory cells;
a comparison circuit for comparing information input for selecting the bit lines with information identifying a defective bit line which, if any, is included among the bit lines;
a first number generating circuit for assigning different numbers to the bit lines and the redundancy bit lines;
at least one second number generating circuit for assigning numbers, which are different from the numbers assigned by the first number generating circuit, to the bit lines and redundancy bit lines; and
a selecting circuit for selecting the bit lines and redundancy bit lines based on the numbers assigned by the first or second number generating circuits and a comparison result output from the comparison circuit.

16. A semiconductor memory device comprising:
a memory cell array including memory cells arranged in a matrix and having a plurality of columns;
at least one redundant column cell array, provided adjacent to said memory cell array, for relieving defective columns in said memory cell array,
a plurality of data lines configured to transfer readout data read out from said memory cell array or write data to be written to said memory cell array,
at least one spare data line provided adjacent to the plurality of data lines, for transferring readout data read out from said redundant column cell array or write data to be written to said redundant column cell array;
a plurality of I/O lines provided correspondingly to said plurality of date lines, for transmitting and receiving readout/write data to and from said plurality of data lines;
an analyzer configured to receive a first reconnection data and column address signal and determine a shift start point for shifting said plurality of data lines in accordance with the first reconnection data and the column address signal;
a first I/O numbering circuit configured to receive a second reconnection data and output a first shift indicating number;
a second I/O numbering circuit configured to output a second shift indicating number different from the first shift indicating number;
a selector circuit connected to said first and said second I/O numbering circuits, said selector circuit selecting one of said first shift indicating number and said second shift indicating number; and
a multiplexor circuit connected to said analyzer and said selector circuit and having a plurality of I/O units, said multiplexor circuit applying one of said first and second shift indicating number to said plurality of I/O units,
wherein in a case where said first shift indicating number is applied to said plurality of I/O units, said multiplexor excludes a data line at a position corresponding to the shift start point and sequentially shifting a plurality of data lines adjacent to said excluded data line on one side thereof correspondingly connecting said plurality of shifted data lines and said at least one spare data line to said plurality of I/O lines.

17. A semiconductor memory device according to claim 16, wherein said first shift indicating number is different for each group of said plurality of I/O units.

18. A semiconductor memory device according to claim 16, wherein said second I/O numbering circuit outputs a shift indicating number corresponding to a forced disable mode for disabling said connection control operation in said multiplexor circuit as said second shift indicating number.

19. A semiconductor memory device according to claim 16, wherein said second I/O numbering circuit outputs a shift indicating number corresponding to a forced access mode for sequentially shifting each of said plurality of data lines in said multiplexor circuit and correspondingly connecting said plurality of shifted data lines and said at least one spare data line to said plurality of I/O lines as said second shift indicating number.

20. A semiconductor memory device comprising:
a memory cell array including memory cells arranged in a matrix and having a plurality of columns;
at least one redundant column cell array, provided adjacent to said memory cell array, for relieving defective columns in said memory cell array;
a plurality of data lines configured to transfer readout data read out from said memory cell array or write data to be written to said memory cell array;
at least one spare data line provided adjacent to the plurality of data lines, for transferring readout data read out from said redundant column cell array or write data to be written to said redundant column cell array,
a plurality of I/O lines provided correspondingly to said plurality of date lines, for transmitting and receiving readout/write data to and from said plurality of data lines;
an analyzer configured to receive a first reconnection data and column address signal and determine a shift start point for shifting said plurality of data lines in accordance with the first reconnection data and the column address signal;
a memory circuit configured to store second reconnection data;
a test mode circuit configured to output at least one test mode signal;
a selector circuit connected to said memory circuit and said test mode circuit, said selector circuit selecting one of said second reconnection data and said at least one test mode signal in accordance with a control signal;
an I/O numbering circuit configured to receive one of said second reconnection data and said at least one test mode signal and output a first shift indicating number or a second shift indicating number having a common value; and
a multiplexor circuit connected to said analyzer and said I/O numbering circuit and having a plurality of I/O units, said multiplexor circuit applying one of said first and second shift indicating number to said plurality of I/O units,
wherein in a case where said first shift indicating number is applied to said plurality of I/O units, said multiplexor excludes a data line at a position corresponding to the shift start point and sequentially shifting a plurality of data lines adjacent to said excluded data line on one side thereof correspondingly connecting said plurality of shifted data lines and said at least one spare data line to said plurality of I/O lines, and in a case wherein said second shift indicating number is applied to said plurality of I/O units, said multiplexor circuit sequentially shifts all of data lines one by one regardless of the shift start point or does not perform a shift operation correspondingly connecting said plurality of data lines to said plurality of I/O lines.

21. A semiconductor memory device according to claim 20, wherein said first shift indicating number is different for each group of said plurality of I/O units.

* * * * *

UNITED STATES PATENT AND TRADEMARK OFFICE
CERTIFICATE OF CORRECTION

PATENT NO.      : 6,459,630 B2
DATED           : October 1, 2002
INVENTOR(S)     : Nakayama et al.

It is certified that error appears in the above-identified patent and that said Letters Patent is hereby corrected as shown below:

<u>Column 25,</u>
Line 37, change "date" to -- data --.

<u>Column 26,</u>
Line 32, change "date" to -- data --.

Signed and Sealed this

Twenty-second Day of April, 2003

JAMES E. ROGAN
*Director of the United States Patent and Trademark Office*